United States Patent [19]

Honda

[11] Patent Number: 5,596,221
[45] Date of Patent: Jan. 21, 1997

[54] BIPOLAR TRANSISTOR WITH EMITTER DOUBLE CONTACT STRUCTURE

[75] Inventor: Hiroki Honda, Hyogo, Japan

[73] Assignee: Mitsubishi Denki Kabushiki Kaisha, Tokyo, Japan

[21] Appl. No.: 463,799

[22] Filed: Jun. 5, 1995

[30] Foreign Application Priority Data

Sep. 29, 1994 [JP] Japan .................................. 6-234875

[51] Int. Cl.[6] ............................ H01L 29/45; H01L 29/73
[52] U.S. Cl. ......................... 257/588; 257/751; 257/757; 257/764; 257/770
[58] Field of Search .................................. 257/588, 587, 257/751, 757, 764, 767, 770

[56] References Cited

U.S. PATENT DOCUMENTS

| | | | |
|---|---|---|---|
| 4,502,209 | 3/1985 | Eizenberg et al. | 257/751 |
| 5,049,975 | 9/1991 | Ajika et al. | 257/751 |
| 5,194,926 | 3/1993 | Hayden | 257/588 |
| 5,345,102 | 9/1994 | Matsumoto | 257/588 |
| 5,442,226 | 8/1995 | Maeda et al. | 257/588 |
| 5,466,971 | 11/1995 | Higuchi | 257/751 |
| 5,475,257 | 12/1995 | Hashimoto | 257/588 |

FOREIGN PATENT DOCUMENTS 3-19235  1/1991  Japan .

OTHER PUBLICATIONS

Hot Carrier Effects in Advanced Self–Aligned Bipolar Transistors, pp. 22–25, Technical Digest IEDM 85, S. A. Peterson et al.

1.2 μm Direct Ion–Implanted Emitter Bi–CMOS Technology, pp. 130–131, Information and Communication Engineers of Japan ICD 87–33, Hiroshi IWAI et al.

Silicides for VLSI Applications, pp. 130–131, Academic Press 1983, S. P. Murarka.

*Primary Examiner*—Jerome Jackson
*Attorney, Agent, or Firm*—Lowe, Price, LeBlanc & Becker

[57] ABSTRACT

An n type collector region is formed at a main surface of a p type silicon substrate. A p type base region is formed at a surface of the collector region. An n type emitter region is formed at a surface of the base region. A polycrystalline silicon layer is formed on a surface of the emitter region. An interlayer insulation layer is formed so as to cover the polycrystalline silicon layer. A contact hole is formed on the emitter region through the interlayer insulation layer and the polycrystalline silicon layer and reaching the surface of the emitter region. A metal electrode is formed within contact hole so as to provide contact with the surface of the emitter region. According to this structure, the emitter resistance can be reduced. Thus, the operation speed of a bipolar transistor can be improved.

18 Claims, 28 Drawing Sheets

BIPOLAR TRANSISTOR WITH EMITTER DOUBLE CONTACT STRUCTURE

BACKGROUND OF THE INVENTION

1. Field of the Invention

The present invention relates to a bipolar transistor and a method of manufacturing thereof. More particularly, the present invention relates to a bipolar transistor that has a polycrystalline silicon layer formed on an emitter region, and a method of manufacturing thereof.

2. Description of the Background Art

A conventional bipolar transistor and a method of manufacturing thereof will be described hereinafter with reference to FIGS. 45–48. FIG. 45 is a sectional view of a conventional bipolar transistor having a polycrystalline silicon layer formed on an emitter region.

First, the structure of a conventional bipolar transistor will be described with reference to FIG. 45. At a main surface of a p type silicon substrate 1, a collector region 2 is formed. A p type base region 3 is formed at the surface of collector region 2. An n type emitter region 4 is formed at the surface of base region 3.

On the main surface of silicon substrate 1, an insulation layer 5 including a contact hole 6 is formed on emitter region 4. Insulation layer 5 is formed of, for example, a silicon oxide film. A polycrystalline silicon layer 7 is formed so as to extend from contact hole 6 onto insulation layer 5. An interlayer insulation layer 8 such as of a silicon oxide film is formed so as to cover polycrystalline silicon layer 7.

Contact holes 9a and 9c are formed through interlayer insulation layer 8 and insulation layer 5 to reach a surface of collector region 2 and a base region 3, respectively. A contact hole 9b is formed through interlayer insulation layer 8 to reach the surface of polycrystalline silicon layer 7. A metal electrode 10 is formed within contact holes 9a, 9b, and 9c.

A method of manufacturing the conventional bipolar transistor of FIG. 45 will be described hereinafter with reference to FIGS. 46–48.

Referring to FIG. 46, an n type collector region 2 and a p type base region 3 are formed at desired regions in the main surface of a p type silicon substrate 1 by ion implantation or the like. Then, an insulation film 5 such as a silicon oxide film is deposited on the main surface of silicon substrate 1 by CVD (Chemical Vapor Deposition). A resist pattern 11j having an opening where emitter region 4 is to be formed is provided on insulation layer 5 by photolithography. Using this resist pattern 11j as a mask, insulation layer 5 is etched to form contact hole 6. Then, resist pattern 11j is removed.

Referring to FIG. 47, polycrystalline silicon layer 7 is formed within contact hole 6 and over insulation layer 5 by CVD. Then, n type impurities are introduced into polycrystalline silicon layer 7. Polycrystalline silicon layer 7 is patterned to a predetermined configuration. Polycrystalline silicon layer 7 is subjected to a thermal treatment, whereby the n type impurities within polycrystalline silicon layer 7 are diffused into base region 3. As a result, an emitter region 4 of shallow diffusion is formed.

Referring to FIG. 48, interlayer insulation layer 8 is formed so as to cover polycrystalline silicon layer 7 and insulation layer 5. On interlayer insulation layer 8, a resist pattern 11k is formed having a predetermined configuration including an opening for the formation of contact holes 9a, 9b and 9c. Using resist pattern 11k as a mask, interlayer insulation layer 8 and insulation layer 5 are etched. As a result, contact holes 9a, 9b and 9c are formed. Then, resist pattern 11k is removed. Metal electrode 10 is formed in each of contact holes 9a, 9b and 9c by sputtering. Thus, the conventional bipolar transistor shown in FIG. 45 is formed.

The above-described conventional bipolar transistor has problems set forth in the following.

Referring to FIG. 49, the above-described conventional bipolar transistor has a polycrystalline silicon layer 7 between emitter region 4 and metal electrode 10. Since polycrystalline silicon has a resistance higher than that of metal, the presence of polycrystalline silicon layer 7 between emitter region 4 and metal electrode 10 provides a relatively high resistance R between emitter region 4 and metal electrode 10. As a result, the emitter resistance is increased to degrade the operating speed of the bipolar transistor.

An approach can be considered of forming direct contact between metal electrode 10 and emitter region 4 without forming polycrystalline silicon layer 7 as shown in FIG. 50 in order to reduce the emitter resistance. FIG. 50 is a sectional view of a conventional bipolar transistor where direct contact is provided between emitter region 4 and metal electrode 10 with no formation of polycrystalline silicon layer on emitter region 4. It is appreciated from FIG. 50 that the emitter resistance can be reduced by the direct contact of metal electrode 10 and emitter region 4.

However, the bipolar transistor of FIG. 50 has a problem which will be described hereinafter with reference to FIGS. 51 and 52.

Referring to FIG. 51, the method of manufacturing the bipolar transistor of FIG. 50 includes the steps of forming emitter region 4 by photolithography and ion implantation, forming interlayer insulation layer 8, and forming a contact hole 9 for providing metal electrode 10 in interlayer insulation layer 8. Contact hole 9 is generally provided by photolithography.

More specifically, as shown in FIG. 51, a resist pattern 11m is used as a mask in the formation of emitter region 4, and resist pattern 11l is used as a mask in the formation of contact hole 9. This means that an overlapping margin W4 must be provided for resist patterns 11m and 11l.

Therefore, the emitter width W3 cannot be made smaller than the dimension of 2×W4. As a result, the dimension of emitter width W3 is relatively increased. It is known that a smaller emitter width W3 allows a higher speed operation in a bipolar transistor. Therefore, such an increase in emitter width W3 induces the problem of degradation in speed of the bipolar transistor.

An approach can be considered of forming emitter region 4 after formation of contact hole 9 as shown in FIG. 52 in order to solve the above-described problem with emitter width W3. In this case, the emitter width can be reduced to W5 since it is not necessary to provide the above-described overlapping margin W4. Therefore, the problem of degradation in the speed of the bipolar transistor caused by increase of the emitter width can be avoided. However, since emitter region 4 can be formed only by ion implantation, there is the problem that the depth D of emitter region 4 is increased. It is known that a smaller depth D of emitter region 4 allows a higher speed operation of the bipolar transistor. Therefore, the problem of degradation in the speed of the bipolar transistor is not solved.

The above-described problem caused by increase in the emitter width W3 and the depth D of emitter region 4 is not encountered in a bipolar transistor that has a polycrystalline silicon layer formed on emitter region 4. This is because emitter region 4 is formed by diffusing the impurities in polycrystalline silicon layer 7 into base region 3. In view of the foregoing, it is preferable to use a bipolar transistor that has a polycrystalline silicon layer formed on an emitter region from the stand point of high speed operation of a bipolar transistor. However, such a bipolar transistor had the problem that the emitter resistance is increased, as described before.

SUMMARY OF THE INVENTION

In view of the foregoing, an object of the present invention is to provide a bipolar transistor of a type that has a polycrystalline silicon layer formed on an emitter region improved in performance characteristics by reducing emitter resistance, and a method of manufacturing such a bipolar transistor.

According to an aspect of the present invention, a bipolar transistor includes a semiconductor substrate of a first conductivity type having a main surface, a collector region of a second conductivity type, a base region of the first conductivity type, an emitter region of the second conductivity type, an insulation layer, a polycrystalline silicon layer, and a metal electrode. The collector region is formed at the main surface of the semiconductor substrate. The base region is formed at the surface of the collector region. The emitter region is formed at the surface of the base region. The insulation layer is formed on the main surface of the semiconductor substrate to have a contact hole reaching the surface of the emitter region. The polycrystalline silicon layer includes a hole defining a part of a contact hole, and is formed within the insulation layer. The metal electrode is formed within the contact hole so as to provide contact with the surface of the emitter region.

According to the above-described bipolar transistor, a hole reaching the surface of an emitter region is provided in a polycrystalline silicon layer, and a metal electrode is formed to contact the surface of the emitter region through this hole. In contrast to the conventional bipolar transistor shown in FIG. 45, the metal electrode and the emitter region are brought into direct contact. This allows reduction of the contact resistance between the metal electrode and the emitter region in comparison with that of a conventional bipolar transistor. Furthermore, when a nitride film is formed on the polycrystalline silicon layer, the thickness of the polycrystalline silicon layer is hardly reduced during the processing step. Therefore, short-circuit between the emitter region and the base region can be suppressed effectively when the polycrystalline silicon layer is converted into a silicide layer.

According to another aspect of the present invention, a bipolar transistor includes a semiconductor substrate of a first conductivity type having a main surface, a collector region of a second conductivity type, a base region of the first conductivity type, an emitter region of the second conductivity type, a silicide layer, an insulation layer, a polycrystalline silicon layer, and a metal electrode. The collector region is formed at the main surface of the semiconductor substrate. The base region is formed at the surface of the collector region. The emitter region is formed at the surface of the base region. The silicide layer is formed on the surface of the emitter region. The insulation layer is formed on the main surface of the semiconductor substrate so as to have a contact hole reaching the surface of the silicide layer. The polycrystalline silicon layer is formed within the insulation layer so as to be continuous with the side face of the silicide layer and so as to enclose the silicide layer. The metal electrode is formed on the silicide layer. A nitride film is preferably formed on this polycrystalline silicon layer, and the above insulation layer is formed on the nitride film.

According to the above-described bipolar transistor, the polycrystalline silicon layer located right beneath the metal electrode is completely converted into a silicide layer. As a result, the metal electrode is electrically connected to the emitter region via the silicide layer. It is therefore possible to reduce the resistance between the metal electrode and the emitter region in comparison with that of a conventional bipolar transistor.

According to an aspect of manufacturing a bipolar transistor, a collector region of a second conductivity type and a base region of a first conductivity type are formed at a main surface of a semiconductor substrate of the first conductivity type. Then, an insulation layer having an opening exposing partially the surface of the base region is formed on the main surface of the semiconductor substrate. A polycrystalline silicon layer including an impurity of the second conductivity type is formed on the surface of the base region located within the opening. By diffusing the impurity of the second conductivity type from the polycrystalline silicon layer to the surface of the base region, an emitter region is formed at the surface of the base region. An interlayer insulation layer is formed on the main surface of the semiconductor substrates so as to cover the polycrystalline silicon layer. First and second contact holes are formed through the interlayer insulation layer and the insulation layer to partially expose the surface of the base region and the surface of the collector region. A third contact hole is formed through the interlayer insulation layer to partially expose the surface of the polycrystalline silicon layer. By applying an etching process on the surface of the partially exposed polycrystalline silicon layer, an opening exposing a surface of the emitter region is formed in the polycrystalline silicon layer. Then, first, second, and third metal electrodes are formed within the first, second, and third contact holes, respectively.

According to the above-described method of manufacturing a bipolar transistor, an emitter region is formed by diffusing an impurity from a polycrystalline silicon layer to the surface of a base region. It is therefore possible to suppress the width of the emitter and the diffusion depth of the emitter region to low values. It is to be noted that the first and second contact hole and the third contact hole are formed by separate steps using separate mask layers. It is therefore possible to selectively expose a surface of the emitter region partially by selectively etching only the polycrystalline silicon layer exposed in the third contact hole using the mask layer used for forming the third contact hole. Thus, a metal electrode can be directly formed on the surface of the emitter region.

According to another aspect of manufacturing a bipolar transistor, a collector region of a second conductivity type and a base region of a first conductivity type are formed at a main surface of a semiconductor substrate of the first conductivity type. An insulation layer having an opening exposing partially a surface of the base region is formed on the main surface of the semiconductor substrate. A polycrystalline silicon layer including an impurity of the second conductivity type is formed on the surface of the base region located within the opening. By diffusing the impurity of the impurity of the second conductivity type from this polycrystalline silicon layer to the surface of the base region, an emitter region is formed at the surface of the base region. An interlayer insulation layer is formed on the main surface of the semiconductor substrate so as to cover the polycrystalline silicon layer. First and second contact holes exposing the surface of the base region and the collector region partially are formed through the interlayer insulation layer and the insulation layer, and a third contact hole partially exposing the surface of the polycrystalline silicon layer is formed through the interlayer insulation layer. Then, a transition metal layer is formed on the inner surface of the first, second, and third contact holes and also on the interlayer insulation layer. The transition metal layer is subjected to a thermal treatment, whereby the surface of the base region located right beneath the first contact hole is converted into a first silicide layer. The surface of the collector region located right beneath the second contact hole is converted into a second silicide layer. The portion of the polycrystalline silicon layer located right beneath the third contact hole is converted into a third silicide layer. Then, first, second, and third metal electrodes are formed on the first, second, and third silicide layers, respectively.

According to the above-described method of manufacturing a bipolar transistor, first, second, and third contact holes are formed simultaneously, and a transition metal layer is formed on the internal surface of the first, second, and third contact holes. A thermal treatment is applied on the transition metal layer. Here, the surface of the base region is exposed within the first contact hole, and the surface of the collector region is exposed within the second contact hole. Also, the surface of the polycrystalline silicon layer located on the emitter region is exposed in the third contact hole. According to the above-described thermal treatment, the partial surface of the base region, the partial surface of the collector region, and the polycrystalline silicon layer located above the emitter region can be converted into first, second, and third silicide layers. Then, a metal electrode is formed on the first, second, and third silicide layers. Thus, the third metal electrode and the emitter region can be electrically connected via the third silicide layer. It is therefore possible to reduce the emitter resistance in comparison with that of a conventional bipolar transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first embodiment of the present invention will be described with reference to FIGS. 1–9.

Figure 1:
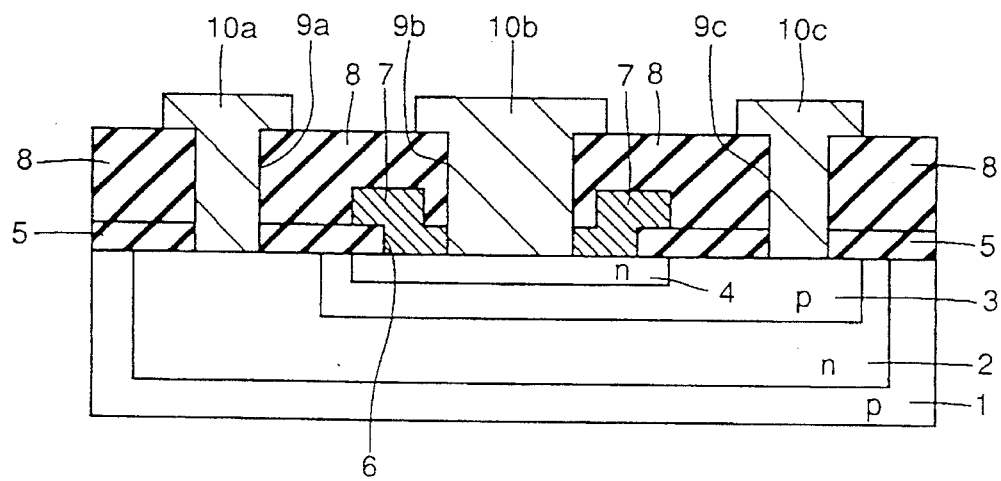
FIG. 1 is a sectional view of a bipolar transistor according to a first embodiment of the present invention.
Figure 45:
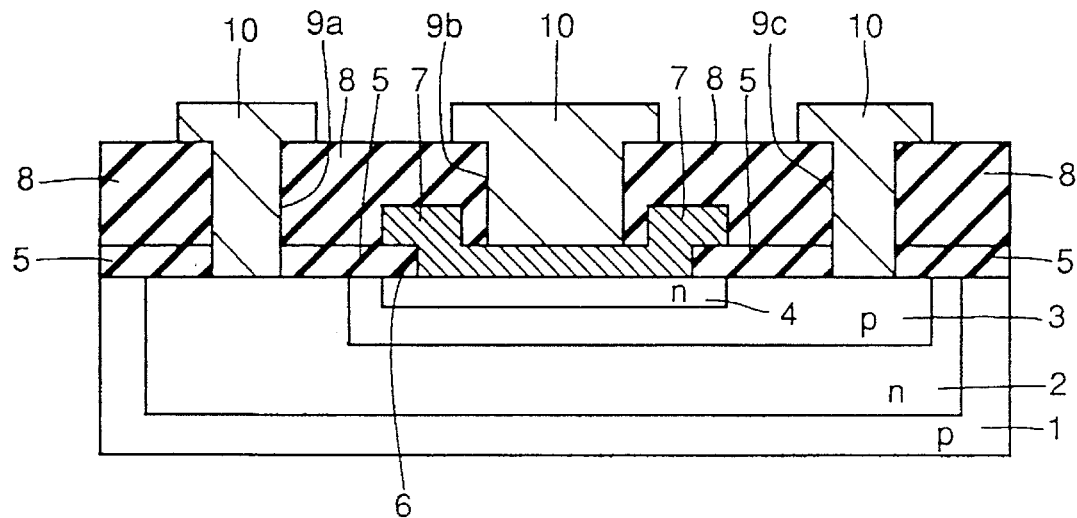
FIG. 45 is a sectional view of a conventional bipolar transistor.
Figure 46:
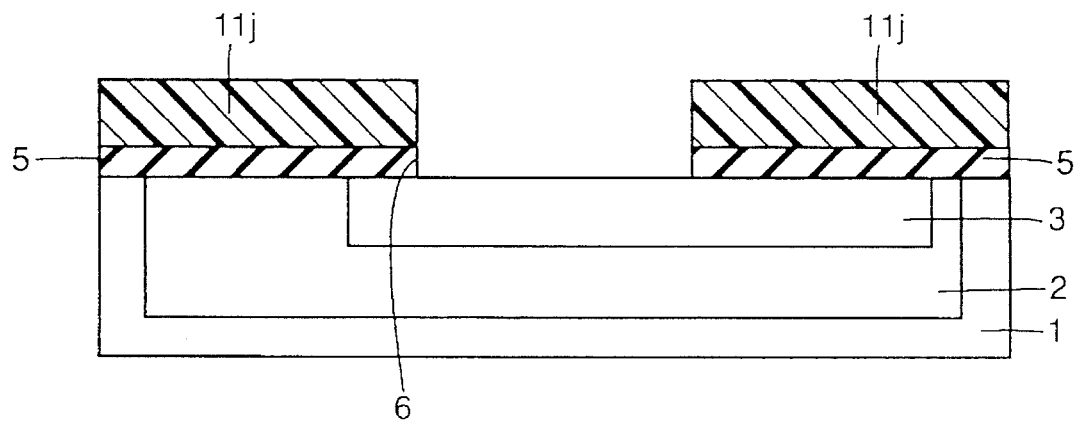
FIGS. 46–48 are sectional views of the bipolar transistor of FIG. 45 showing first to third manufacturing steps thereof.
Figure 47:
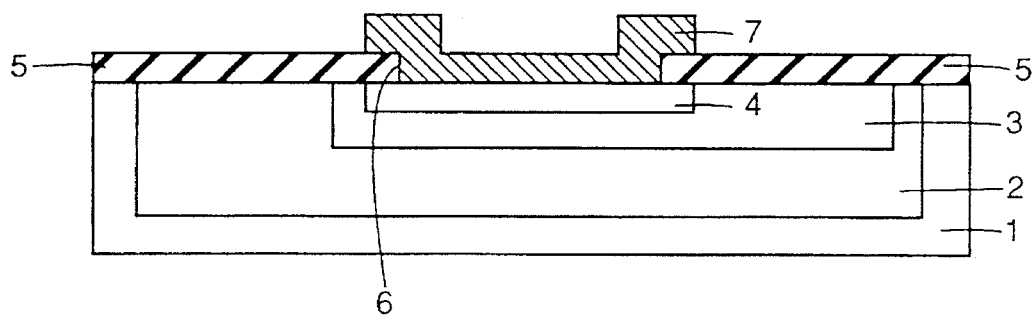
Figure 48:
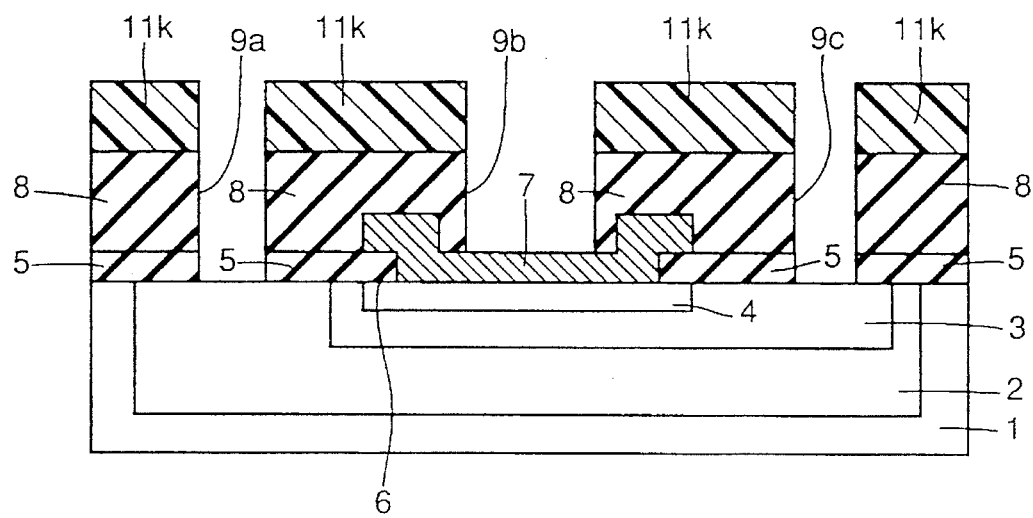
Figure 49:
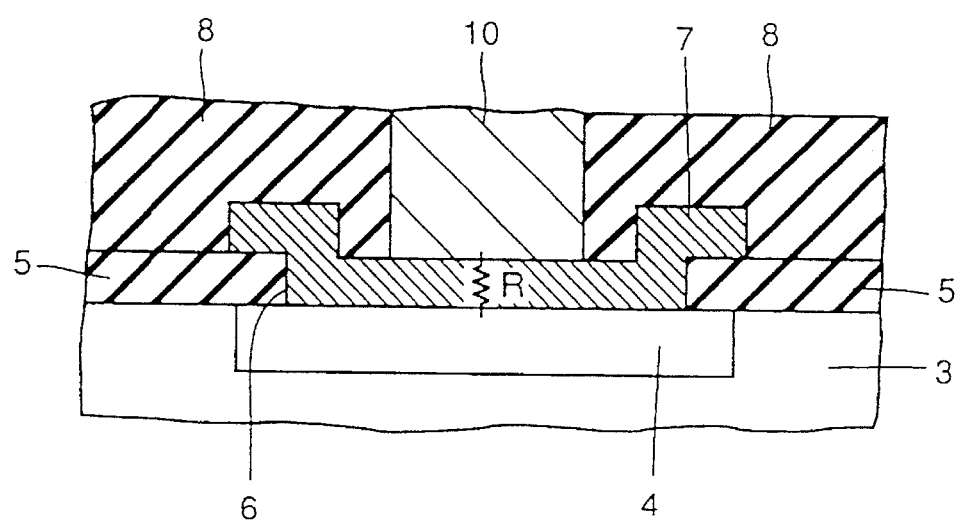
FIG. 49 is a schematic diagram of the conventional bipolar transistor of FIG. 45 for describing the problems thereof.
Figure 50:
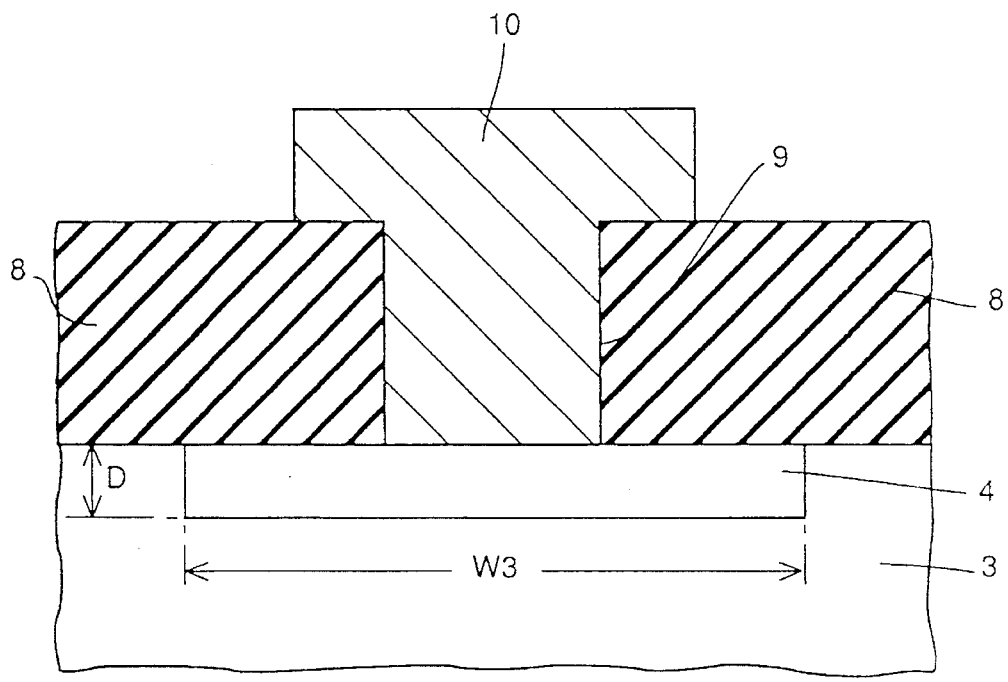
FIG. 50 is a partial sectional view of a conventional bipolar transistor having a metal electrode and an emitter region brought into direct contact.
Figure 51:
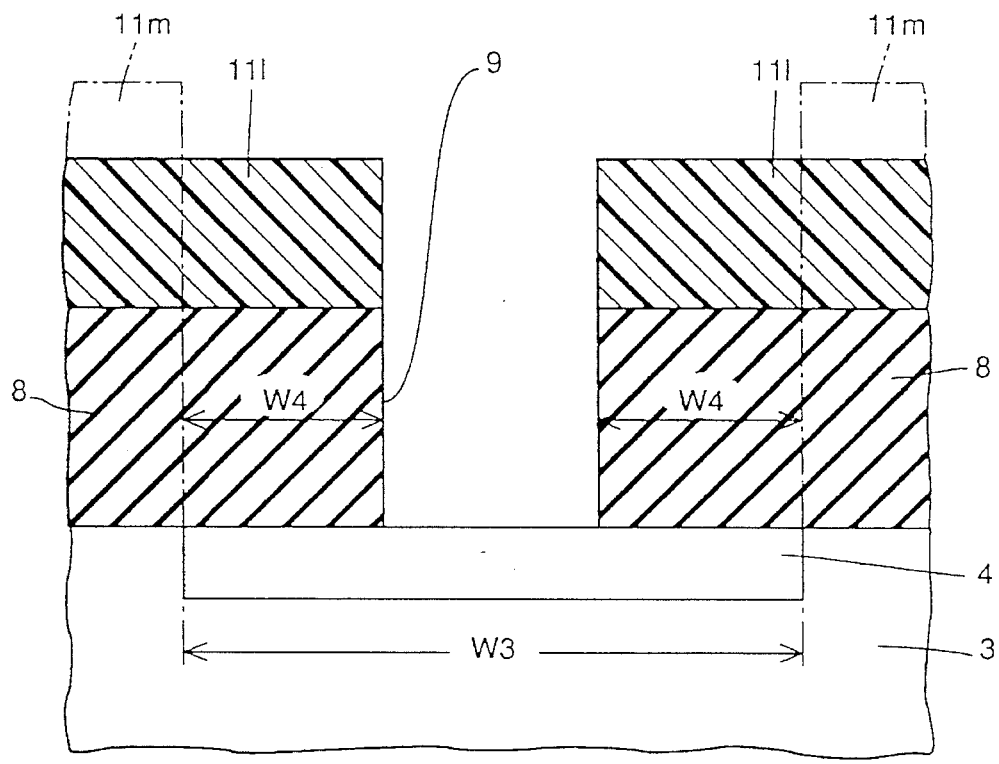
FIGS. 51 and 52 are diagrams of the bipolar transistor of FIG. 50 for describing the problems thereof.
Figure 52:
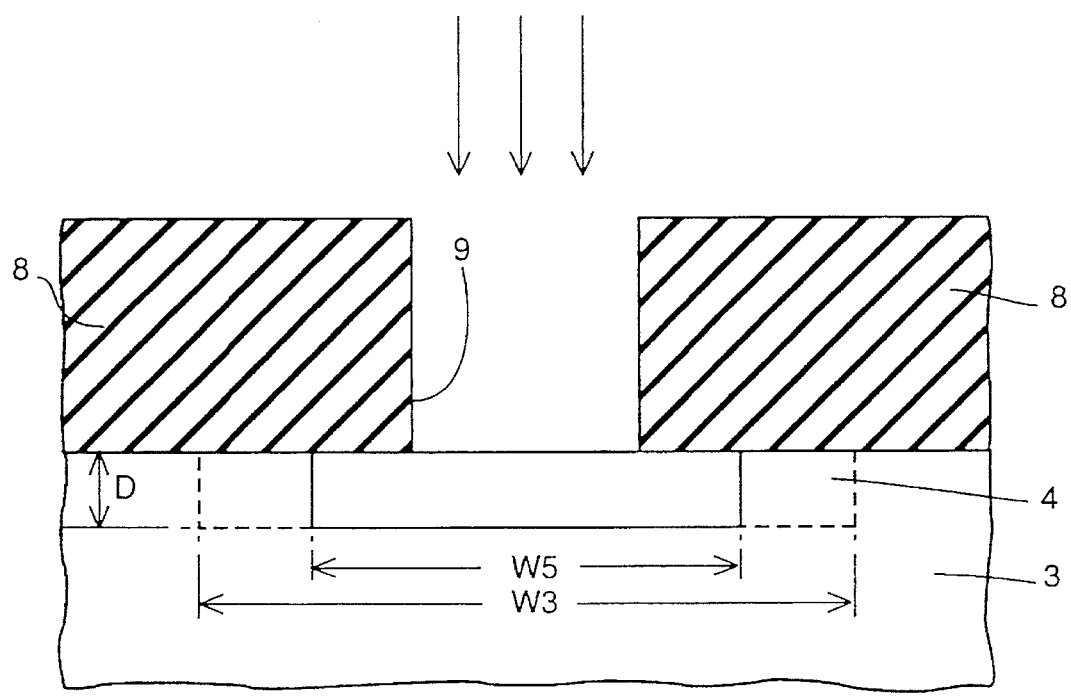

Referring to FIG. 1, a contact hole 9b is formed through a polycrystalline silicon layer 7 so as to reach the surface of an emitter region 4. A metal electrode 10b is formed within contact hole 9b so as to provide contact with the surface of emitter region 4. Metal electrode 10b may be formed of Al/Cu, W, etc. Since metal electrode 10b and emitter region 4 are brought into contact with each other, the resistance therebetween can be reduced in comparison with that of the conventional bipolar transistor shown in FIG. 45. Thus, a bipolar transistor is obtained that can have emitter resistance reduced and that can operate at high speed. The remaining structure is similar to that of the conventional bipolar transistor of FIG. 45.

A plane structure of a bipolar transistor of the present embodiment will be described with reference to FIG. 2. FIG. 1 is a sectional view taken along lines I—I of FIG. 2.

Figure 2:
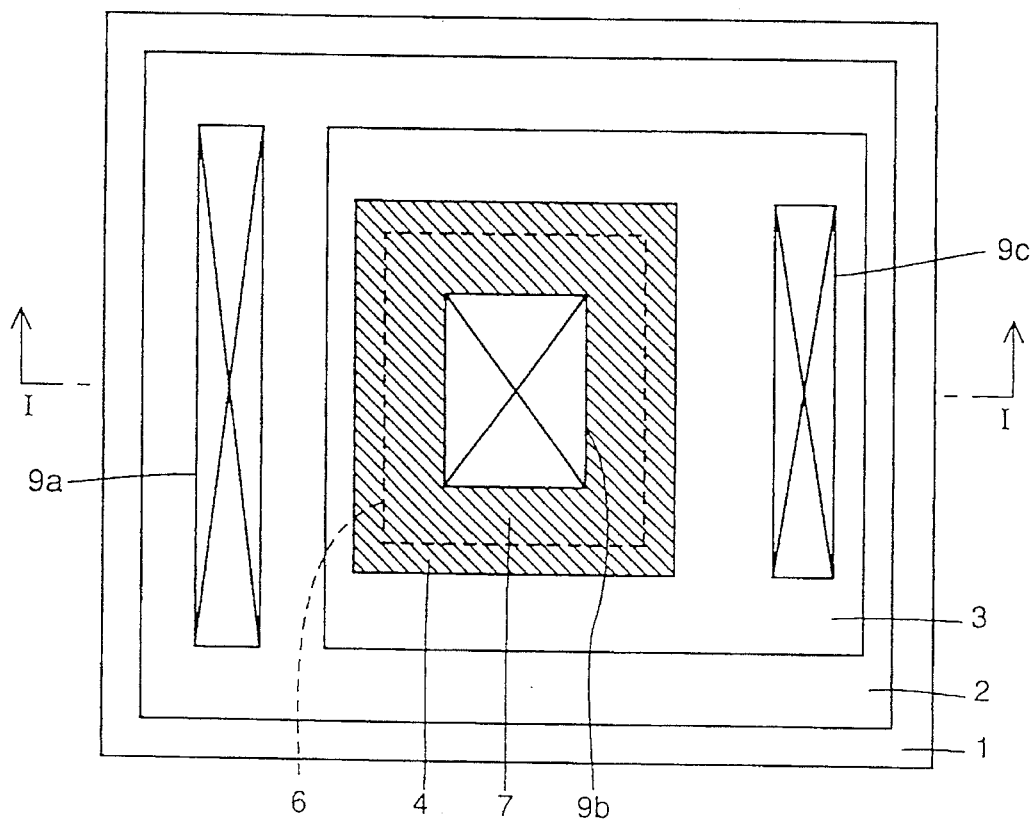
FIG. 2 is a plan view of the bipolar transistor of FIG. 1.

Referring to FIG. 2, polycrystalline silicon layer 7 is formed so as to define and surround contact hole 9b. Since metal electrode 10b is formed within contact hole 9b, an external circumferential face of metal electrode 10b is brought into contact with polycrystalline silicon layer 7. In contact hole 6, partial surfaces of polycrystalline silicon layer 7 and emitter region 4 are brought into contact.

A method of manufacturing the bipolar transistor of FIG. 1 will be described with reference to FIGS. 3–7.

Figure 3:
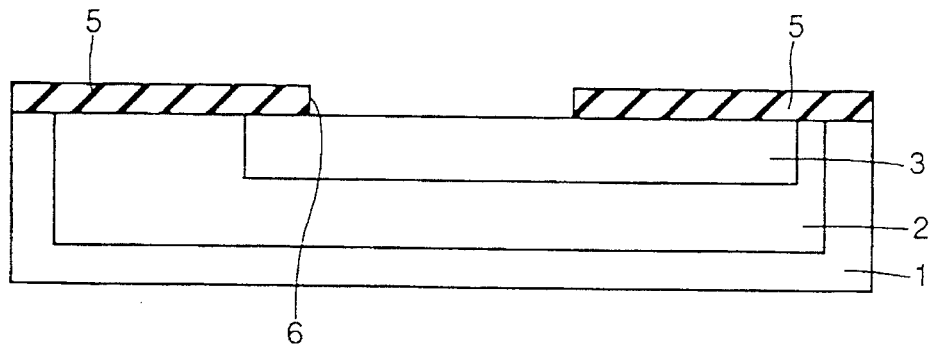
FIGS. 3–7 are sectional views of the bipolar transistor of the first embodiment showing first to fifth manufacturing steps thereof.
Figure 4:
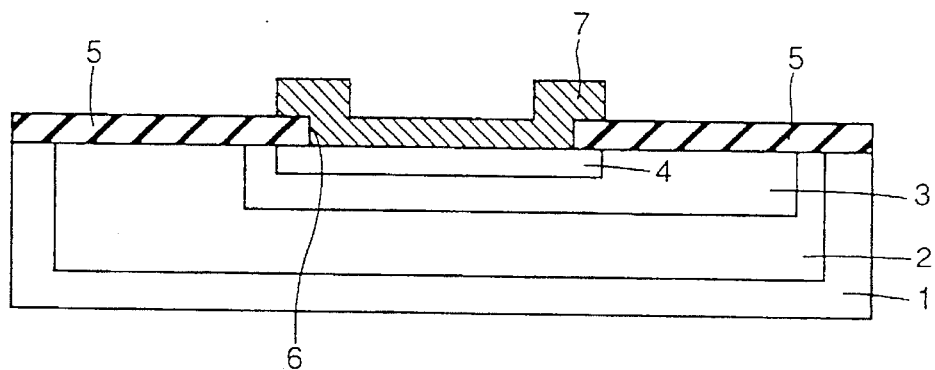

The manufacturing steps prior to the step shown in FIG. 3 are similar to conventional manufacturing steps. An insulation layer 5 such as of a silicon oxide film is formed with a contact hole 6. Referring to FIG. 4, a polycrystalline silicon layer 7 including n type impurities such as arsenic (As) is formed to a thickness of approximately 200Å–approximately 2000Å by a conventional step. Polycrystalline silicon layer 7 is then subjected to a thermal treatment. As a result, the n type impurities of polycrystalline silicon layer 7 are diffused into base region 3 to form an emitter region 4. An emitter region of a small emitter width and diffusion depth can be formed. Thus, high speed operation of a bipolar transistor can be ensured.

Figure 5:
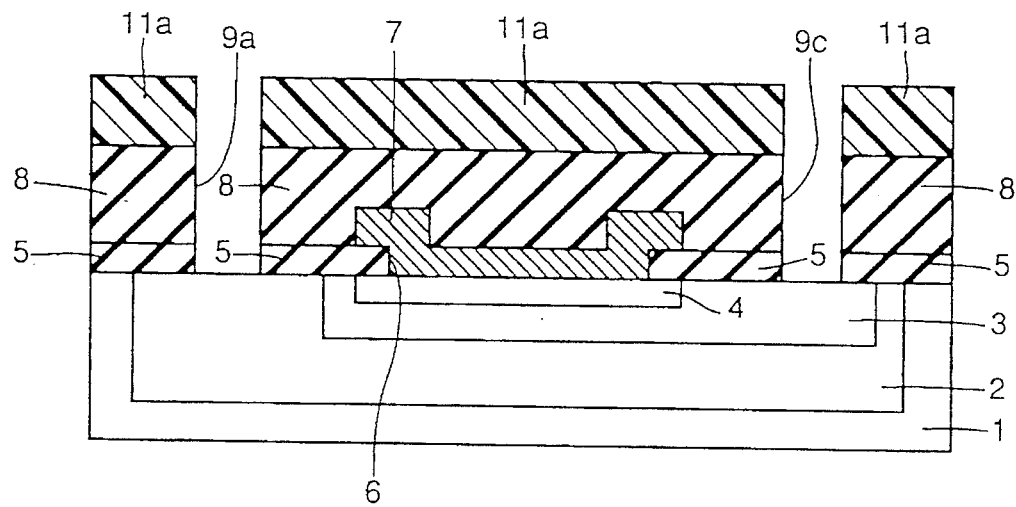

Referring to FIG. 5, an interlayer insulation layer 8 such as of a silicon oxide film is formed so as to cover insulation layer 5 and polycrystalline silicon layer 7 by CVD. A resist pattern 11a having openings corresponding to the location of contact holes 9a and 9c is formed on interlayer insulation layer 8. Using this resist pattern 11a as a mask, interlayer insulation layer 8 and insulation layer 5 are etched. As a result, a contact hole 9a partially exposing the surface of collector region 2 and a contact hole 9c partially exposing a surface of base region 3 are formed.

Figure 6:
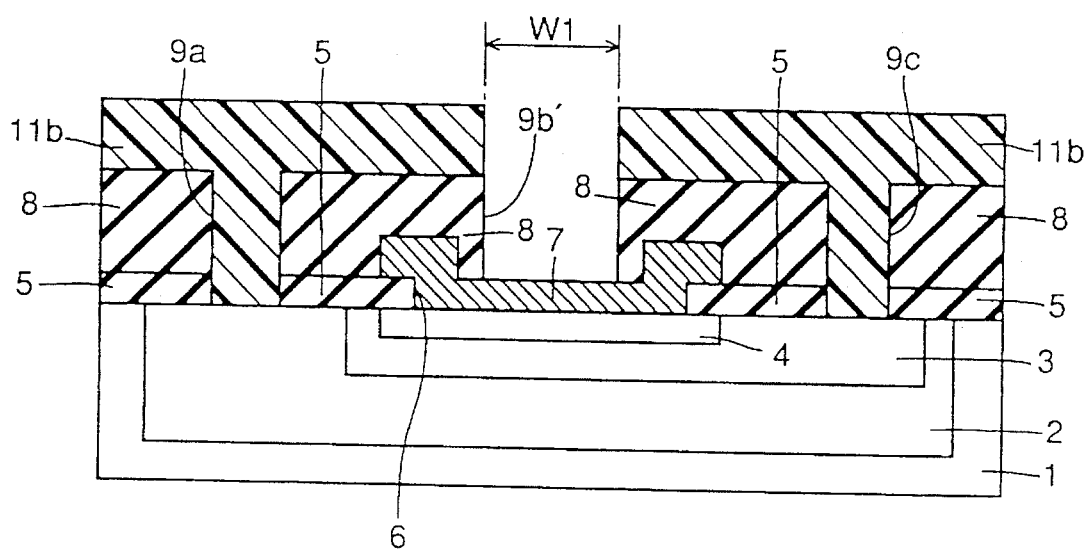

Referring to FIG. 6, following removal of resist pattern 11a, a resist pattern 11b having an opening with a width of W1 corresponding to the position of a contact hole 9b is formed on interlayer insulation layer 8. Using resist pattern 11b as a mask, interlayer insulation layer 8 is etched. As a result, a contact hole 9b' exposing a surface of polycrystalline silicon layer 7 partially is formed. According to the state shown in FIG. 6, the opening width W1 of contact hole 9b is smaller than the opening width of contact hole 6.

Figure 7:
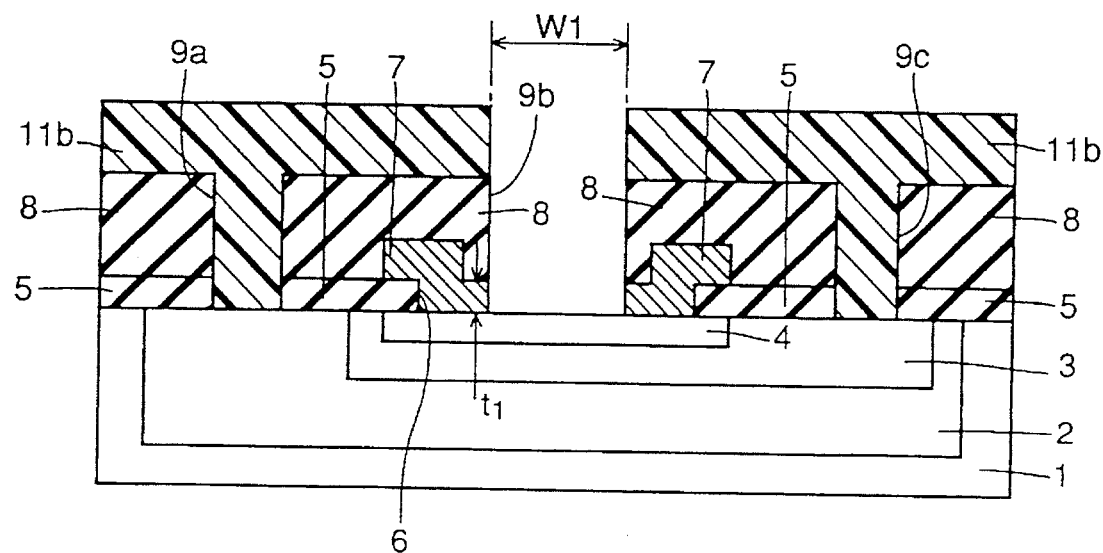

Referring to FIG. 7, using resist pattern 11b again as a mask, polycrystalline silicon layer 7 is etched away by a thickness of t1 to expose a surface of emitter region 4 partially. Then, resist pattern 11b is removed. Metal electrodes 10a, 10b, and 10c are formed within contact holes 9a, 9b and 9c according to conventional steps. Thus, the bipolar transistor shown in FIG. 1 is formed.

Figure 8:
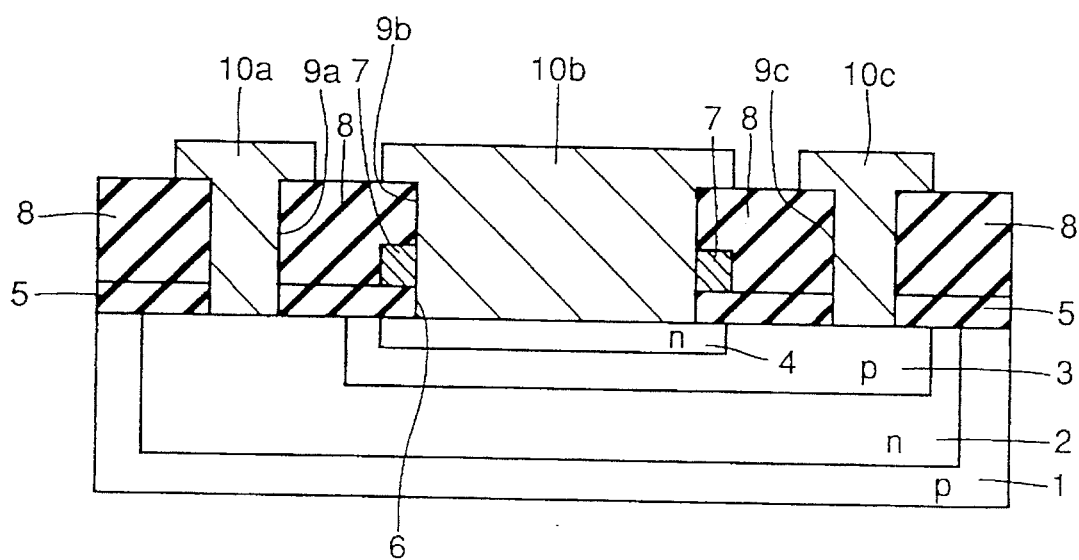
FIG. 8 is a sectional view of a modification of the bipolar transistor according to the first embodiment of the present invention.

A modification of the present first embodiment will be described with reference to FIGS. 8 and 9. FIG. 8 is a sectional view of a modification of the bipolar transistor of the first embodiment, and FIG. 9 is a sectional view of the bipolar transistor of FIG. 8 showing a characteristic manufacturing step thereof.

In the above first embodiment, polycrystalline silicon layer 7 and metal electrode 10b are both brought into contact with the surface of emitter region 4. In the present modification shown in FIG. 8, only metal electrode 10b forms contact with the surface of emitter region 4. Such a structure provides the advantage of increasing the contact area between metal electrode 10b and emitter region 4 in comparison with that of the above-described first embodiment. The contact resistance between emitter region 4 and metal electrode 10b can further be reduced than the above first embodiment.

Figure 9:
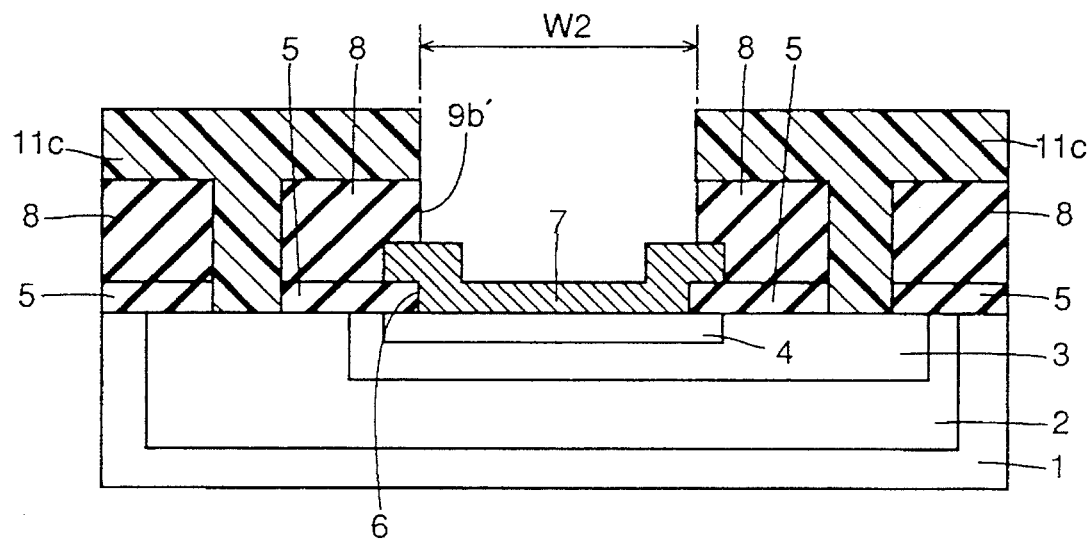
FIG. 9 is a sectional view of the bipolar transistor of FIG. 8 showing a characteristic manufacturing step.

Referring to FIG. 9, in forming contact hole 9b, resist pattern 11c having an opening width W2 greater than opening width W1 is formed on interlayer insulation layer 8. Interlayer insulation layer 8 is etched using resist pattern 11c as a mask. Therefore, a contact hole 9b' having an opening width W2 greater than opening width W1 is formed. Then, manufacturing steps similar to those of the above-described first embodiment are carried out to result in the bipolar transistor shown in FIG. 8.

Second Embodiment

A second embodiment of the present invention will be described with reference to FIGS. 10–13.

Figure 10:
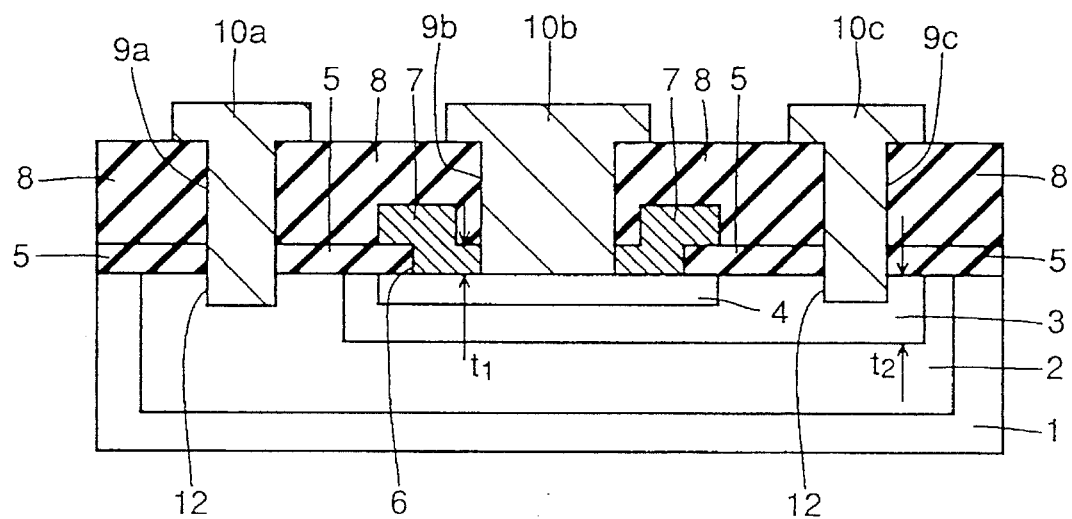
FIG. 10 is a sectional view of a bipolar transistor according to a second embodiment of the present invention.

Referring to FIG. 10, a concave portion 12 is formed at the surface of collector region 2 right beneath contact hole 9a. Another concave portion 12 is formed at the surface of base region 3 right beneath contact hole 9c. Metal electrodes 10a and 10c are formed within concave portions 12, respectively. The remaining structure is similar to that of the bipolar transistor of the first embodiment shown in FIG. 1.

The provision of a concave portion 12 allows increase in the contact area between metal electrode 10a and collector region 2, and between metal electrode 10c and base region 3. Therefore, the contact resistance can further be reduced than that of the above-described first embodiment. In the present embodiment, a diffusion depth of t2 of base region 3 must be greater than thickness t1 of polycrystalline silicon layer 7 to effectively prevent shorting between base region 3 and collector region 2.

Figure 11:
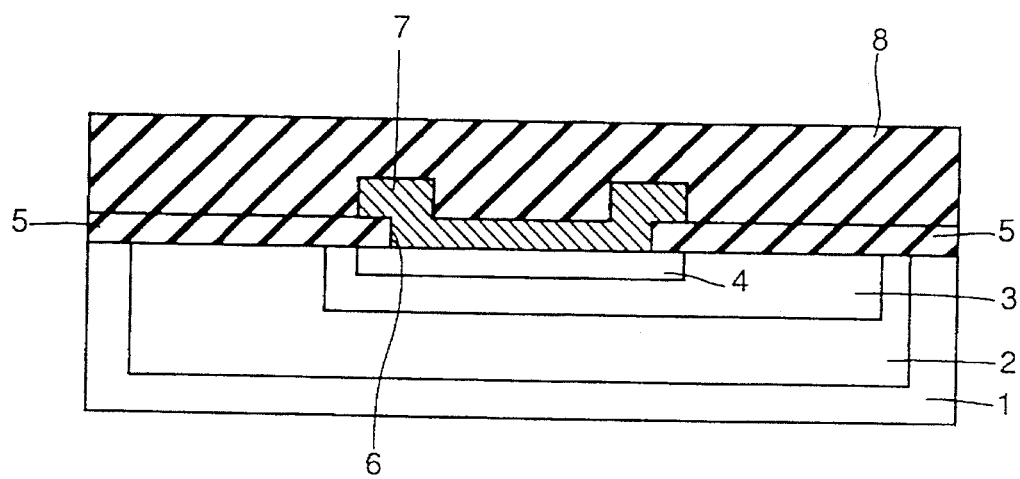
FIGS. 11–13 are sectional views of the bipolar transistor of FIG. 10 showing the first to third manufacturing steps thereof.

A method of manufacturing the bipolar transistor of FIG. 10 will be described with reference to FIGS. 11–13. Manufacturing steps similar to those of the above-described first embodiment are carried out until interlayer insulation layer 8 is formed as shown in FIG. 11.

Figure 12:
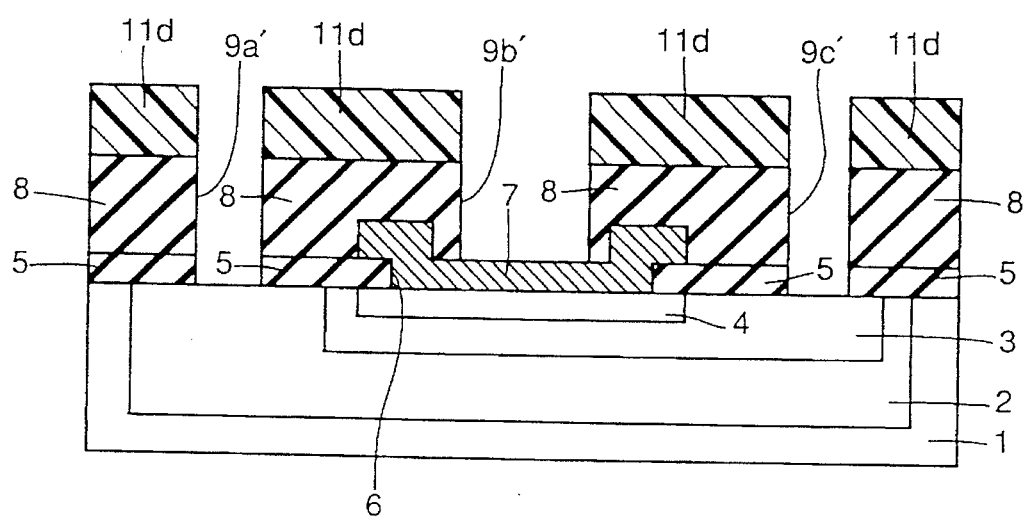

Referring to FIG. 12, a resist pattern 11d having openings corresponding to the positions of contact holes 9a, 9b and 9c is formed on interlayer insulation layer 8. Using resist pattern 11d as a mask, interlayer insulation layer 8 and insulation layer 5 are etched to result in the formation of contact holes 9a', 9b' and 9c'.

Using resist pattern 11d again as a mask, polycrystalline silicon layer 7 is etched to partially expose a surface of emitter region 4. Simultaneously, a surface of collector region 2 right beneath contact hole 9a' and a surface of base region 3 right beneath contact hole 9c are also subjected to etching.

Figure 13:
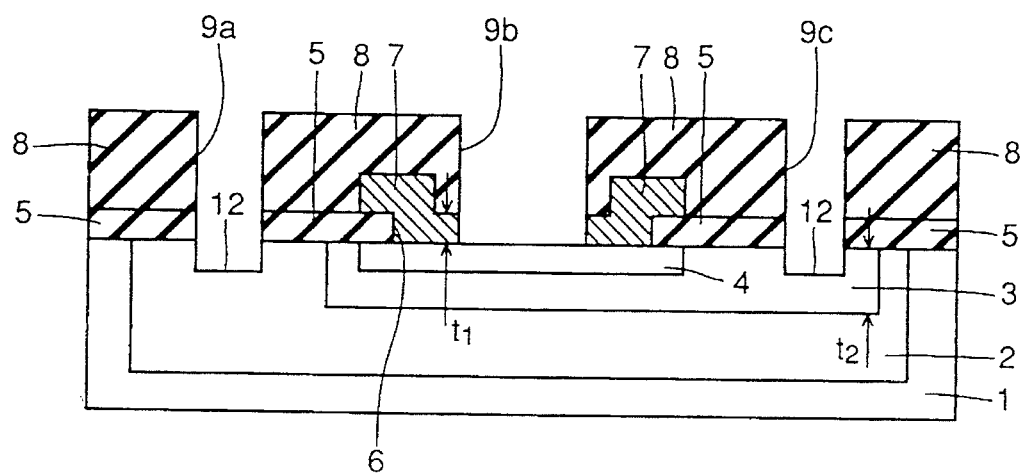

Referring to FIG. 13, a concave portion 12 having a depth substantially equal to thickness t1 of polycrystalline silicon layer 7 is formed. Then, resist pattern 11d is removed.

In the formation of the above concave portion 12, diffusion depth t2 of base region 3 is set greater than thickness t1 of polycrystalline silicon layer 7. This to effectively prevent concave portion 12 from reaching the junction between base region 3 and collector region 2. Thus, shorting between base region 3 and collector region 2 is prevented.

Resist pattern 11d may be removed prior to etching of polycrystalline silicon layer 7. When an external base region of high concentration is formed at the contact portion between base region 3 and metal electrode 10c in order to reduce the contact resistance therebetween, the diffusion depth of the external base region must be greater than thickness t1 of polycrystalline silicon layer 7.

Following the formation of contact holes 9a, 9b and 9c, metal electrodes 10a, 10b, and 10c are formed according to manufacturing steps similar to those of the above-described first embodiment. Thus, the bipolar transistor shown in FIG. 10 is formed.

According to the method of manufacturing a bipolar transistor of the present embodiment, the number of photolithographic steps can be reduced in comparison with that of the above-described first embodiment. Therefore, the manufacturing cost can be reduced in comparison with that of the first embodiment.

Third Embodiment

A third embodiment of the present invention will be described with reference to FIGS. 14–19.

Figure 14:
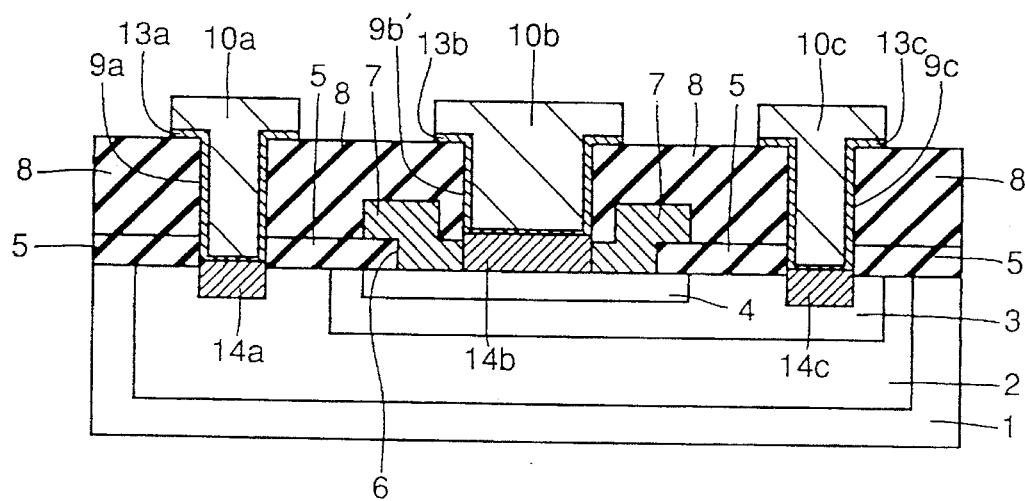
FIG. 14 is a sectional view of a bipolar transistor according to a third embodiment of the present invention.

Referring to FIG. 14, a polycrystalline silicon layer 7 located right beneath contact hole 9b' in the bipolar transistor of the present embodiment is converted into a titanium silicide (TiSix (x~2.0)) layer 14b. The bottom face of titanium silicide layer 14b is in contact with a partial surface of emitter region 4. Then, a titanium nitride (TiN) layer 13b is formed on titanium silicide layer 14. Metal electrode 10b is formed on titanium nitride layer 13b. More specifically, metal electrode 10 is electrically connected to emitter region 4 via titanium nitride layer 13b and titanium silicide layer 14b. As a result, the resistance between emitter region 4 and metal electrode 10 can be reduced in comparison with that of a conventional case.

A titanium silicide layer 14a is formed on a surface of collector region 2 right beneath contact hole 9a, and a titanium silicide layer 14c is formed on a surface of base region 3 right beneath contact hole 9c. In these cases, metal electrode 10a is electrically connected to collector region 2 via titanium nitride layer 13a and titanium silicide layer 14a. Metal electrode 10c is electrically connected to base region 3 via titanium nitride layer 13c and titanium silicide layer 14c. The remaining structure is substantially similar to that of the bipolar transistor of the first embodiment shown in FIG. 1.

The structure of the connection between metal electrode 10b and emitter region 4 will be described in detail with reference to FIG. 15.

Figure 15:
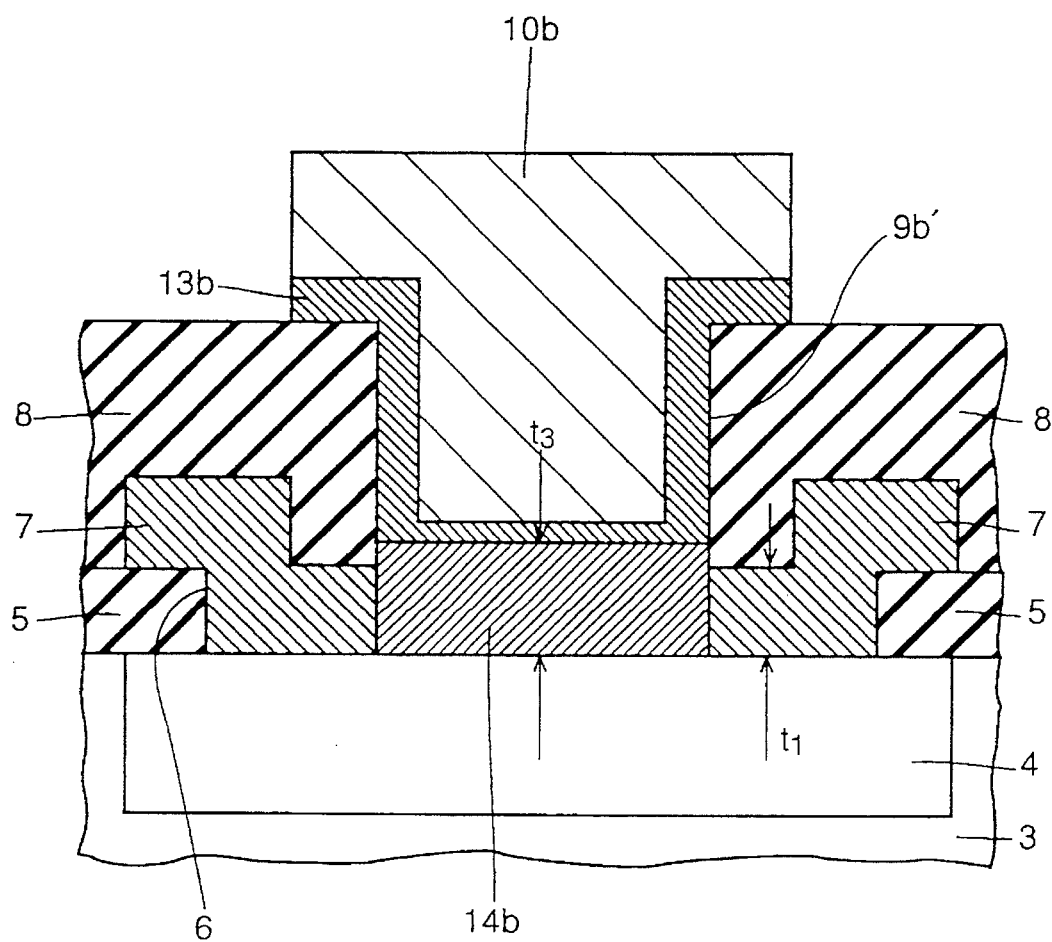
FIG. 15 is a sectional view of the bipolar transistor of FIG. 14 having the connection portion of the metal electrode and the emitter region enlarged.

Referring to FIG. 15, since titanium silicide layer 14b is formed by reaction between polycrystalline silicon layer 7 and the titanium layer formed thereon, thickness t3 becomes greater than thickness t1 of polycrystalline silicon layer 7. Titanium nitride layer 13b extends on titanium silicide layer 14b, on the side face of contact hole 9b', and on the upper face of interlayer insulation layer 8 located beneath metal electrode 10b. Titanium nitride layer 13b serves as a barrier layer to prevent reaction between metal electrode 10b and silicon substrate 1. Thus, the provision of titanium nitride layer 13b effectively prevents reaction between metal electrode 10b and silicon substrate 1.

A method of manufacturing the bipolar transistor of the present embodiment will be described with reference to FIGS. 16–19.

Figure 16:
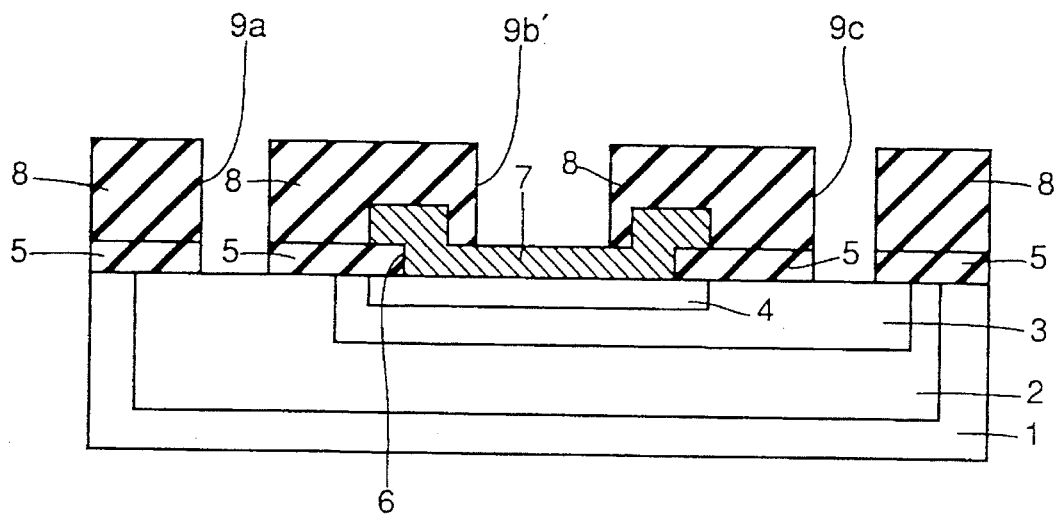
FIGS. 16–18 are sectional views of the bipolar transistor of FIG. 14 showing the first to third manufacturing steps thereof.
Figure 17:
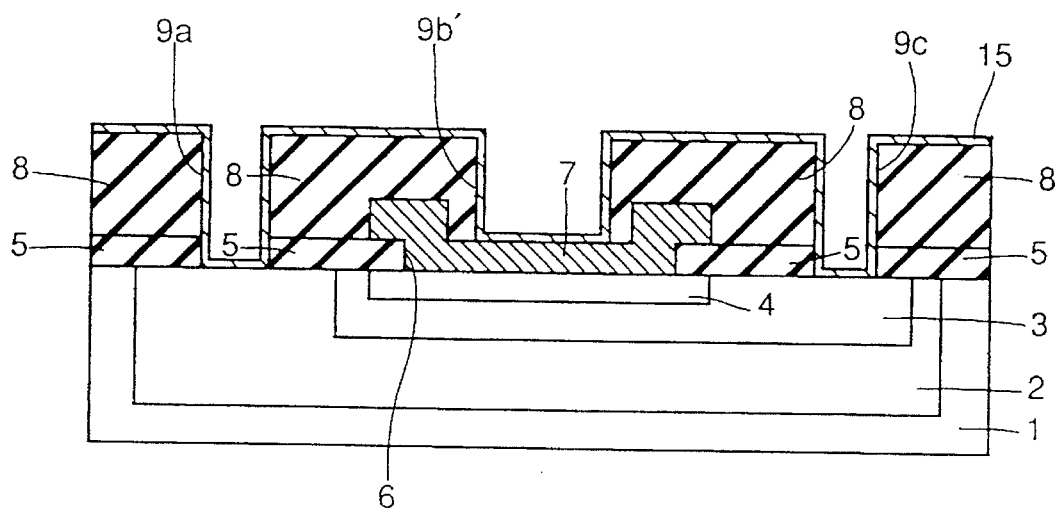

Referring to FIG. 16, contact holes 9a, 9b', 9c are formed according to manufacturing steps similar to those of the above-described second embodiment. Referring to FIG. 17, titanium layer 15 is formed on the inside surface of contact holes 9a, 9b', and 9c and on interlayer insulation layer 8 by sputtering or the like.

Figure 18:
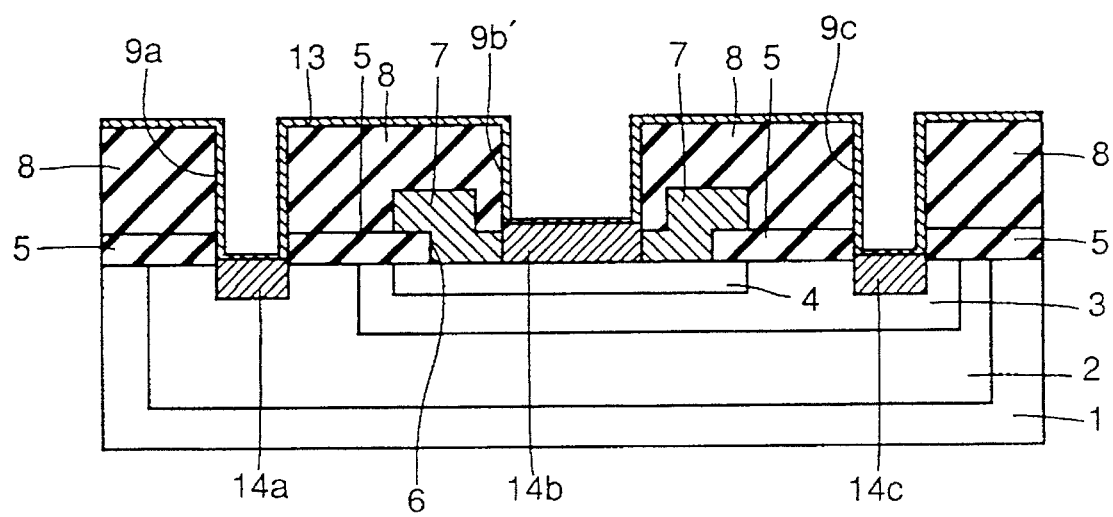

Referring to FIG. 18, a thermal treatment is applied on the titanium layer at 700° C.–1000° C. for up to 60 seconds in a nitride ambient. As a result, a portion of titanium layer 15, a partial surface of silicon substrate 1 in contact with titanium layer 15, and polycrystalline silicon layer 7 in contact with titanium layer 15 are converted into titanium silicide layers 14a, 14b and 14c, respectively. Here, the portion of titanium layer 15 not in contact with silicon substrate 1 and polycrystalline silicon layer 7 is converted into a titanium nitride layer 13.

Figure 19:
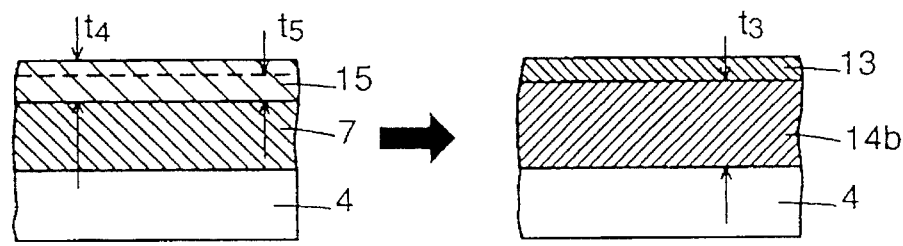
FIG. 19 is a schematic diagram for describing the formation of a silicide layer according to the third embodiment.

The formation step of the above-described titanium silicide layer 14b will be described in detail with reference to FIG. 19. A portion of titanium layer 15 having a thickness of t5 (t5=0.4t4–0.7t4) which is 40–70% of the initial thickness t4 reacts with polycrystalline silicon layer 7. As a result, a titanium silicide layer 14b of a thickness of t6 (t6=2.51t5) is formed. The detail is described in "*SILICIDES FOR VLSI APPLICATIONS*", ACADEMIC PRESS, 1983. In order to obtain a complete silicide reaction of polycrystalline silicon layer 7 of the thickness of t1, the following relationship must be satisfied:

$$t1 \leq 2.27\ t5 = 0.908\ t4 - 1.589\ t4$$

$$t4 \geq 1.10\ t1 - 0.63\ t1 > 0.6\ t1$$

By determining the thickness of t1 of polycrystalline silicon layer 7 and the thickness of t4 of titanium layer 15 to satisfy the above relationship, polycrystalline silicon layer 7 located right beneath contact hole 9b' can be entirely converted into titanium silicide layer 14b. Thus, contact can be provided between emitter region 4 and titanium silicide layer 14b. Thus, the emitter resistance can be reduced.

Then, metal electrodes 10a, 10b and 10c are formed according to manufacturing steps similar to those of the above-described first embodiment, and metal electrodes 10a, 10b and 10c and titanium nitride layers 13a, 13b and 13c are patterned to a predetermined configuration. Thus, a bipolar transistor shown in FIG. 14 is obtained.

Figure 20:
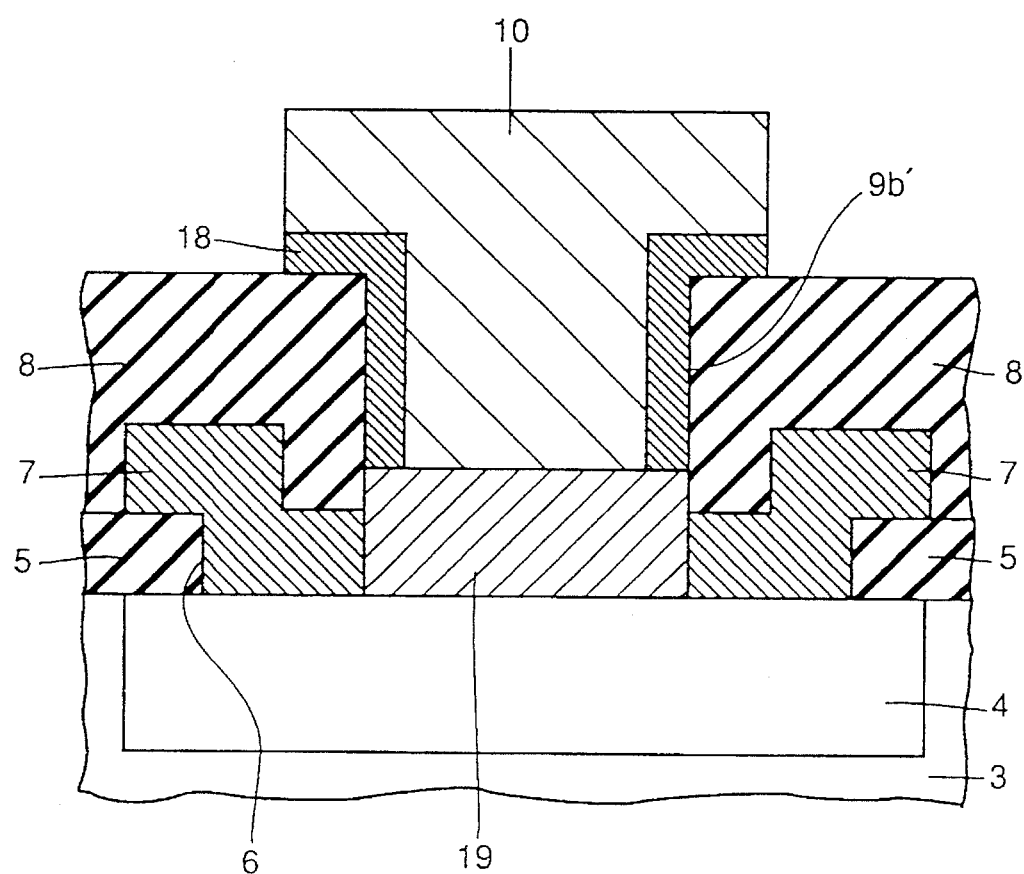
FIG. 20 is a sectional view of the connection between a metal electrode and an emitter region where a transition metal other than titanium is used.

Although the above embodiment is described in which a titanium layer 15 is used, another transition metal may be used instead of titanium layer 15. For example, Co, Ni, Pt, Zr, Hf, V, Nb, Ta, Cr, Mo, W, and Pd can be enumerated. FIG. 20 shows a sectional view of a bipolar transistor corresponding to FIG. 15 showing the case where a transition metal layer other than titanium is used.

Referring to FIG. 20, when a transition metal layer other than titanium layer is used, a transition metal silicide layer 19 is formed so as to provide direct contact between transition metal silicide layer 19 and metal electrode 10. Transition metal layer 18 remains at the side of contact hole 9b'. Similar to the case where a titanium layer is used, the emitter resistance can be reduced in comparison with that of the conventional bipolar transistor.

Fourth Embodiment

A fourth embodiment of the present invention will be described with reference to FIGS. 21 and 22. In the above-described third embodiment, it is necessary to set thickness t4 of titanium layer 15 with respect to thickness t1 of polycrystalline silicon layer 7 so that t4>0.6t1 since titanium layer 15 does not entirely react with polycrystalline silicon layer 7. The present embodiment provides the advantage of reducing thickness t4 of titanium layer 15.

Figure 21:
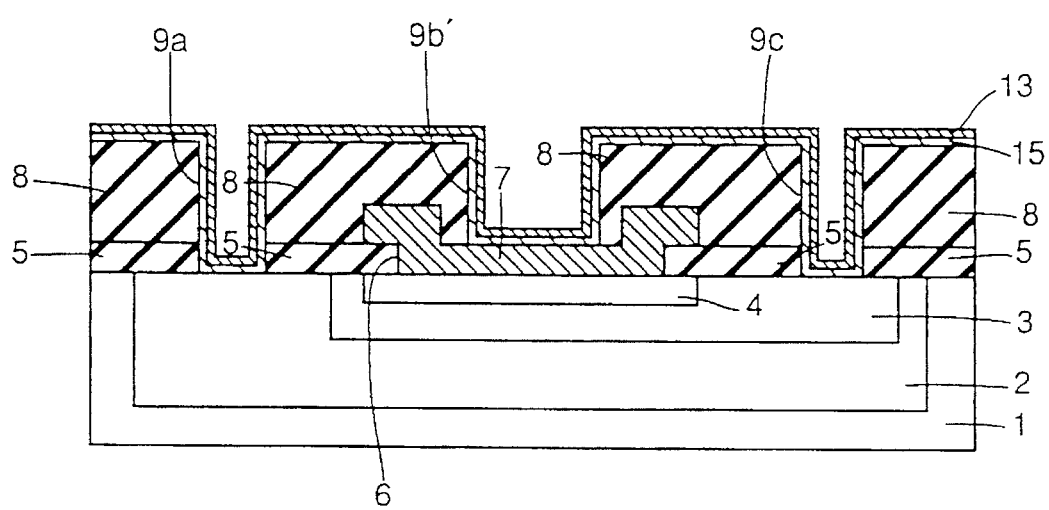
FIG. 21 is a sectional view of a bipolar transistor according to a fourth embodiment of the present invention showing an characteristic manufacturing step thereof.

Referring to FIG. 21, titanium layer 15 is formed according to manufacturing steps similar to those of the above-described third embodiment. A titanium nitride layer 13 is formed on titanium layer 15 by sputtering or the like. Then, a thermal treatment similar to that of the third embodiment is applied to form titanium silicide layers 14a, 14b, and 14c. By forming titanium nitride layer 13 on titanium layer 15, titanium layer 15 that forms contact with silicon substrate 1 and polycrystalline silicon layer 7 can be converted entirely into titanium silicide layers 14a, 14b and 14c. Thus, the thickness of titanium layer 15 can be made smaller than that of the third embodiment.

The method of forming titanium silicide layer 14b according to the present embodiment will be described in detail with reference to FIG. 22.

Figure 22:
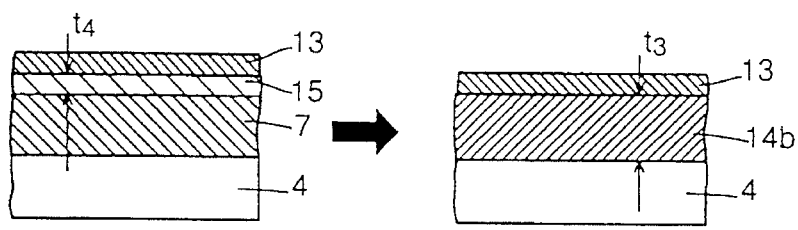
FIG. 22 is a schematic diagram for describing formation of a silicide layer according to the fourth embodiment of the present invention.

Referring to FIG. 22, the application of a thermal treatment as described above causes reaction of titanium layer 15 entirely with polycrystalline silicon layer 7, resulting in the formation of titanium silicide layer 14b. Here, titanium layer 15 with a thickness of t4 reacts with polycrystalline silicon layer 7 having a thickness of 2.27t4. As a result, a titanium silicide layer 14b of a thickness of t3 (t3=2.51t4) is formed. The relationship of t1≦2.27t4 must be satisfied for entire reaction of polycrystalline silicon layer 7 with a thickness of t1. More specifically, the relationship of t4≧0.44t1>0.4t1 must be satisfied. It is therefore possible to reduce thickness t4 of titanium layer 15 in comparison with the case of the above third embodiment (t4>0.6t1). A polycrystalline silicon layer 7 of a greater thickness can be converted into a titanium silicide layer 14b with titanium layer 15 of the same thickness as the third embodiment.

Fifth Embodiment

A fifth embodiment of the present invention will be described hereinafter with reference to FIGS. 23–27.

In the above described third and fourth embodiments, there may be a case where direct contact between titanium silicide layer 14b and emitter region 4 is not obtained when the thickness of polycrystalline silicon layer 7 is greater than a desired value. The present embodiment is provided for such cases.

Figure 23:
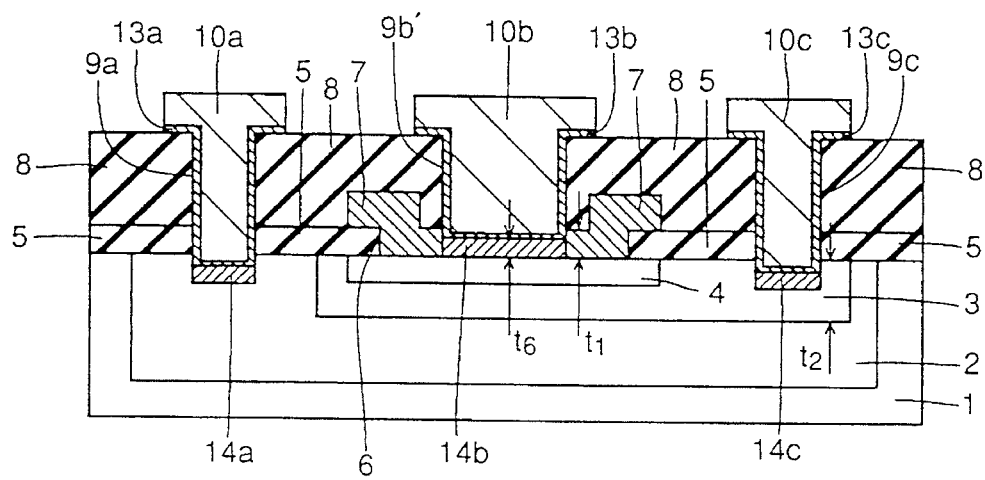
FIG. 23 is a sectional view of a bipolar transistor according to a fifth embodiment of the present invention.

Referring to FIG. 23, the upper face of titanium silicide layers 14a, 14b and 14c is located at a lower level in comparison with that of the above-described third embodiment. Furthermore, thickness t6 of titanium silicide layer 14b is equal or less than thickness t1 of polycrystalline silicon layer 7. The remaining structure is similar to that of the third embodiment shown in FIG. 14.

A method of manufacturing the bipolar transistor of the present embodiment will be described with reference to FIGS. 24–27.

Figure 24:
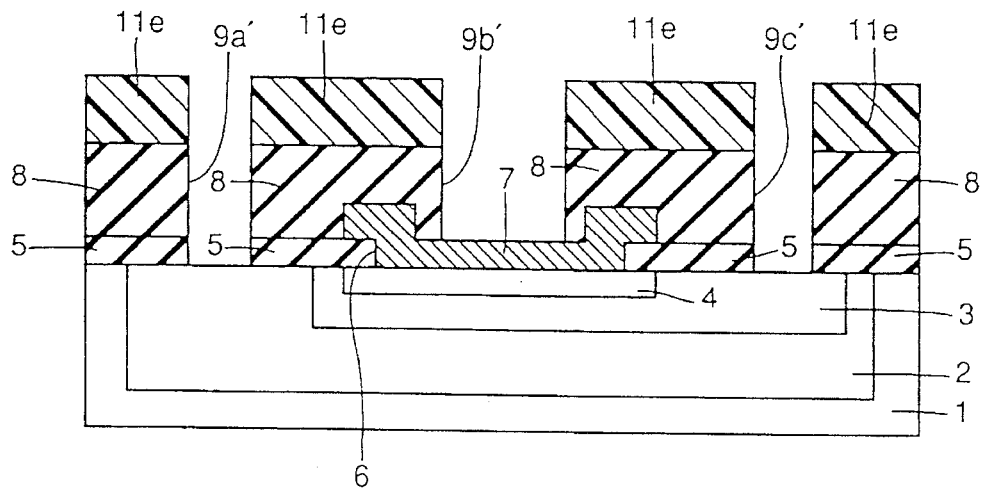
FIGS. 24–27 are sectional views of the bipolar transistor of FIG. 23 showing first to fourth manufacturing steps thereof.

Referring to FIG. 24, according to manufacturing steps similar to those of the above-described second embodiment, resist pattern 11e is formed. Using resist pattern 11e as a mask, contact holes 9a', 9b' and 9c' are formed. Then, a surface of collector region 2 exposed within contact hole 9a', a surface of polycrystalline silicon layer 7 exposed within contact hole 9b', and a surface of base region 3 exposed within contact hole 9c' are subjected to an etching process.

Figure 25:
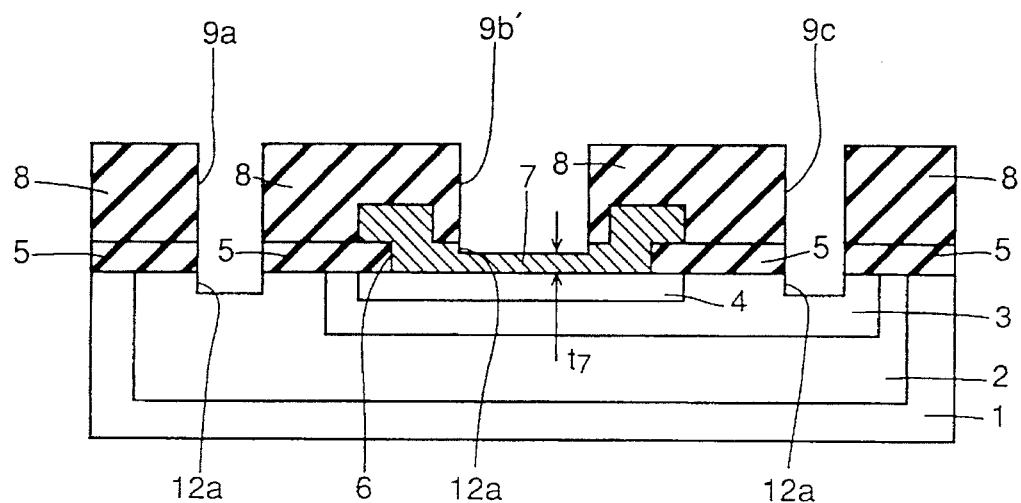

As a result, concave portions 12a are formed as shown in FIG. 25. Therefore, the thickness t7 of polycrystalline silicon layer 7 located right beneath contact hole 9b' is smaller than the initial thickness t1 of polycrystalline silicon layer 7.

Figure 26:
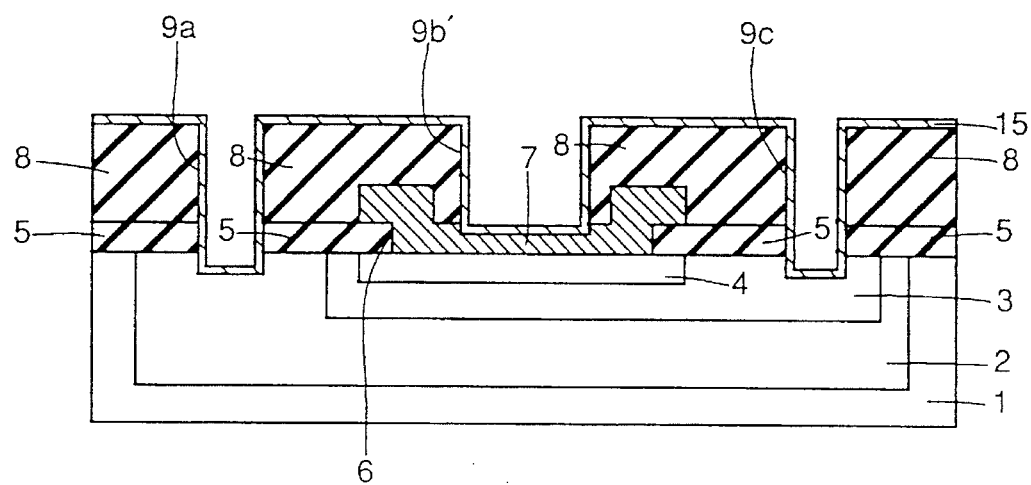
Figure 27:
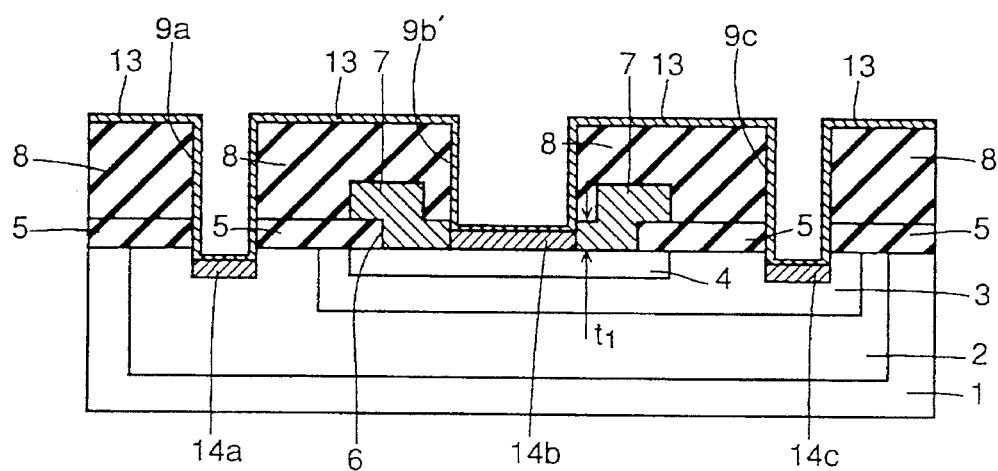

Referring to FIG. 26, a titanium layer 15 is formed according to manufacturing steps similar to those of the third embodiment. By applying a thermal treatment similar to the above-described third embodiment on titanium layer 15, titanium silicide layers 14a, 14b and 14c are respectively formed as shown in FIG. 27. Here, a nitride titanium layer 13 is also formed similar to the third embodiment.

Then, manufacturing steps similar to those of the third embodiment are carried out to result in the formation of the bipolar transistor shown in FIG. 23. The present embodiment is applicable to the above-described fourth embodiment.

According to the method of manufacturing a bipolar transistor of the present embodiment, reliable contact can be obtained between emitter region 4 and titanium silicide layer 14b even when the initial thickness t1 of polycrystalline silicon layer 7 is great. Since thickness t1 of polycrystalline silicon layer 7 can be formed at a thick level, the degree of freedom of the process can be increased.

Sixth Embodiment

A sixth embodiment of the present invention will be described with reference to FIGS. 28–36.

Figure 28:
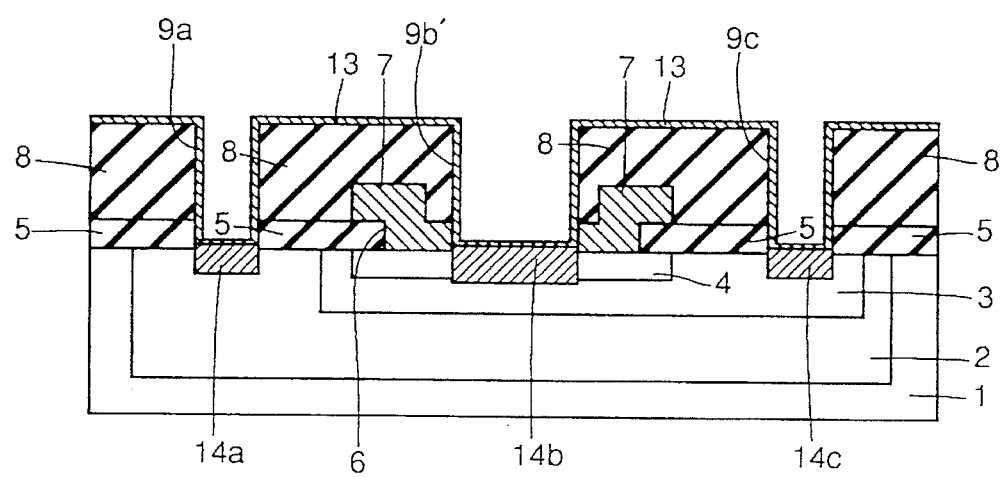
FIG. 28 is a sectional view of a bipolar transistor showing the problem in the case where the thickness of the polycrystalline silicon layer on the emitter region is reduced.

The above fifth embodiment was described in which the thickness of polycrystalline silicon layer 7 located right beneath contact hole 9b' is reduced. However, titanium silicide layer 14b may be formed into silicon substrate 1 when the thickness of polycrystalline silicon layer 7 is reduced or when the thickness of titanium layer 15 is great. Although there is no problem if titanium silicide layer 14b remains within emitter region 4, shorting will occur between emitter region 4 and base region 3 when titanium silicide layer 14b reaches base region 3. FIG. 28 is a sectional view showing a short-circuit established between emitter region 4 and base region 3 due to titanium silicide layer 14b reaching base region 3 within silicon substrate 1. The present embodiment is directed to avoid the problem shown in FIG. 28.

Figure 29:
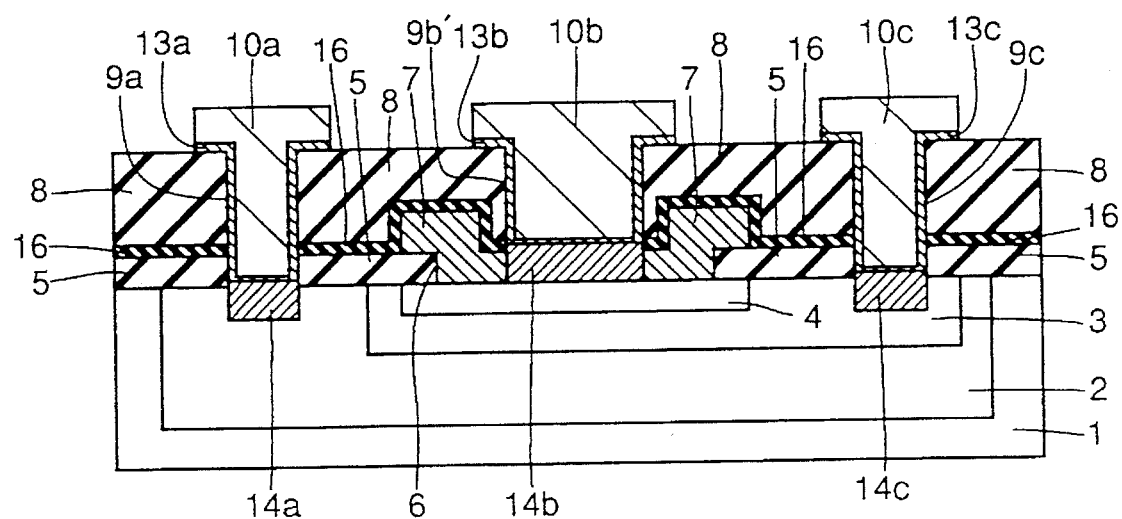
FIG. 29 is a sectional view of a bipolar transistor according to a sixth embodiment of the present invention.

FIG. 29 is a sectional view showing a bipolar transistor of the sixth embodiment. Referring to FIG. 29, a silicon nitride film 16 is formed on polycrystalline silicon layer 7 and insulation layer 5. The formation of such a silicon nitride film 16 provides the advantage of effectively preventing decrease in the thickness of polycrystalline silicon layer 7 located right beneath contact hole 9b'. Thus, shorting between emitter region 4 and base region 3 can be prevented effectively. The remaining structure is similar to that of the bipolar transistor of the third embodiment shown in FIG. 14.

A method of manufacturing the bipolar transistor according to the present invention shown in FIG. 29 will be described with reference to FIGS. 30–32.

Figure 30:
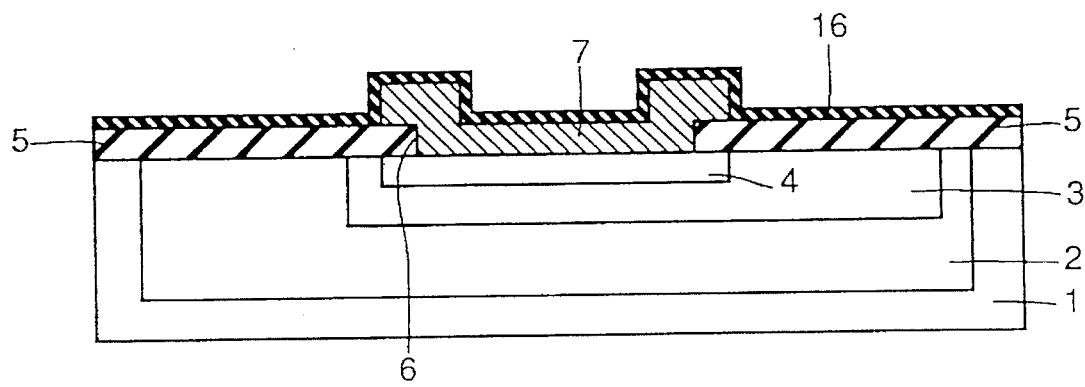
FIGS. 30–32 are sectional views of the bipolar transistor of FIG. 29 showing the first to third manufacturing steps thereof.

Referring to FIG. 30, according to manufacturing steps similar to those of the first embodiment, emitter region 4 is formed. Then, a silicon nitride film 16 is formed on polycrystalline silicon layer 7 and insulation layer 5 by CVD or the like.

Figure 31:
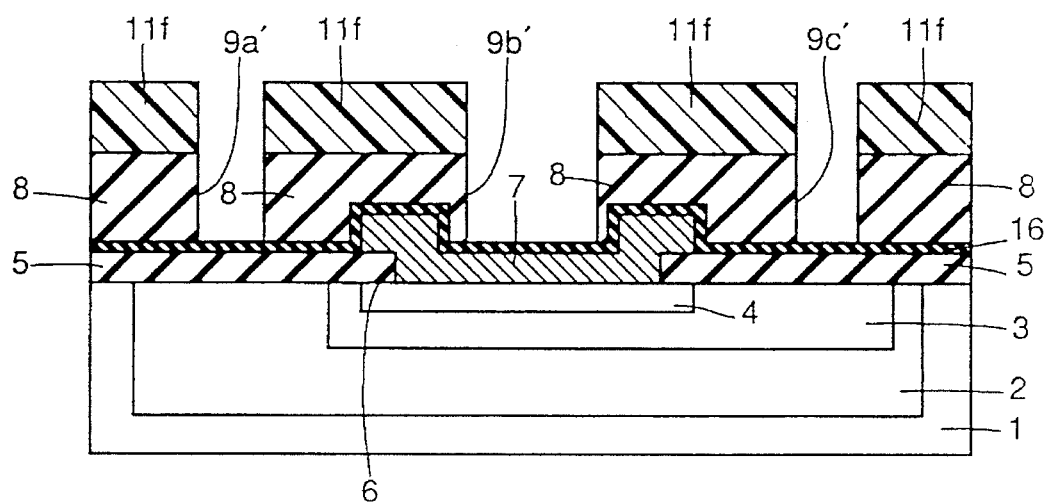

Referring to FIG. 31, an interlayer insulation layer 8 is formed on silicon nitride film 16 by CVD or the like. On interlayer insulation layer 8, a resist patter 11f having an opening corresponding to each location of contact holes 9a, 9b', and 9c is formed. Using resist pattern 11f as a mask, interlayer insulation layer 8 is etched. Etching of interlayer insulation layer 8 is carried out with a great etching selectivity between silicon nitride film 16 and interlayer insulation layer 8. Thus, silicon nitride film 16 may serve as an etching stopper. The etching operation of interlayer insulation layer 8 stops at the surface of silicon nitride film 16.

Figure 32:
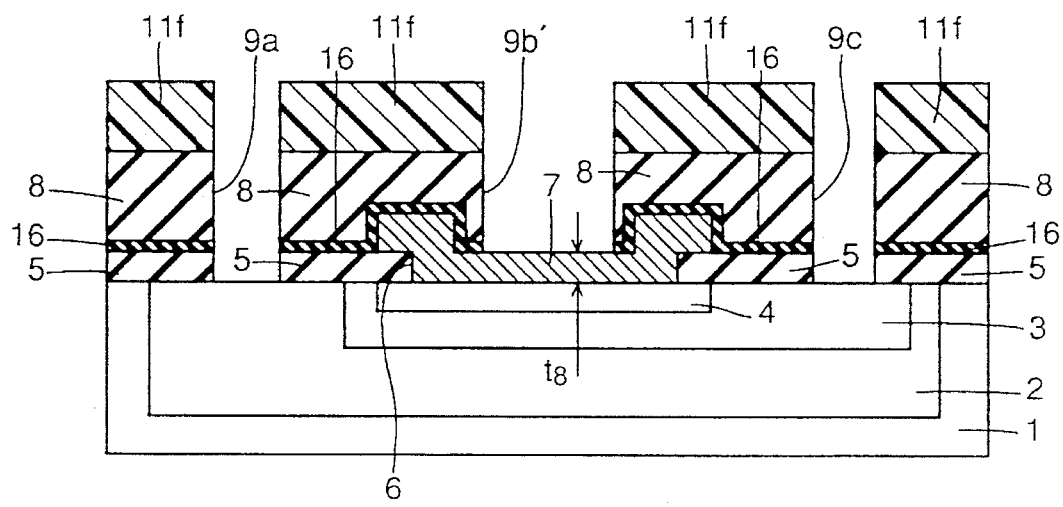

Referring to FIG. 32, silicon nitride film 16 and then insulation layer 5 are etched to expose a surface of collector region 2, a surface of base region 3, and a surface of polycrystalline silicon layer 7. Here, polycrystalline silicon layer 7 located right beneath contact hole 9b' is only subjected to the overetching of silicon nitride film 16 and the etching of insulation layer 5 formed of a silicon oxide film. Therefore, the thickness of polycrystalline silicon layer 7 located right beneath contact hole 9b' shows almost no change. Thus, shorting between emitter region 4 and base region 3 can be prevented effectively. More specifically, a stable contact between titanium silicide layer 14b and emitter region 4 can be provided.

A modification of the above-described sixth embodiment will be described with reference to FIGS. 33–36. The present modified bipolar transistor has a structure similar to that of the bipolar transistor shown in FIG. 29 except that a silicon oxide film 17 is formed between silicon nitride film 16 and polycrystalline silicon layer 7.

Figure 33:
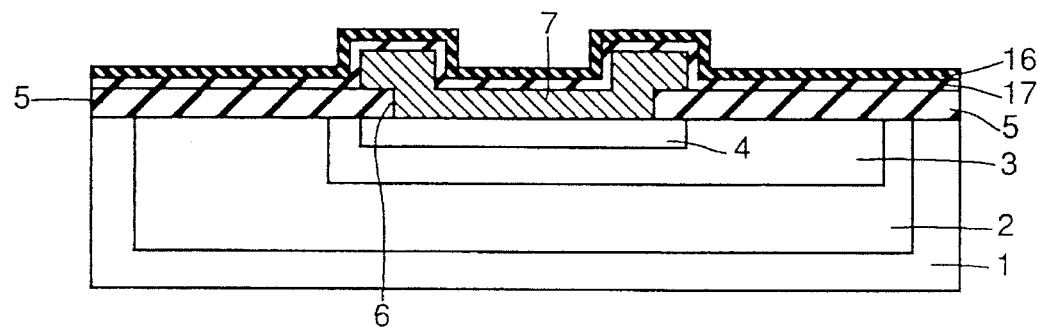
FIGS. 33–36 are sectional views of a modification of the bipolar transistor of the sixth embodiment of the present invention showing first to fourth manufacturing steps thereof.

Referring to FIG. 33, an emitter region 4 is formed according to manufacturing steps similar to those of the above-described sixth embodiment. Then, a silicon oxide film 17 is formed by CVD or the like on polycrystalline silicon layer 7 and on insulation layer 5. A silicon nitride film 16 is formed on silicon oxide film 17 by CVD or the like.

Figure 34:
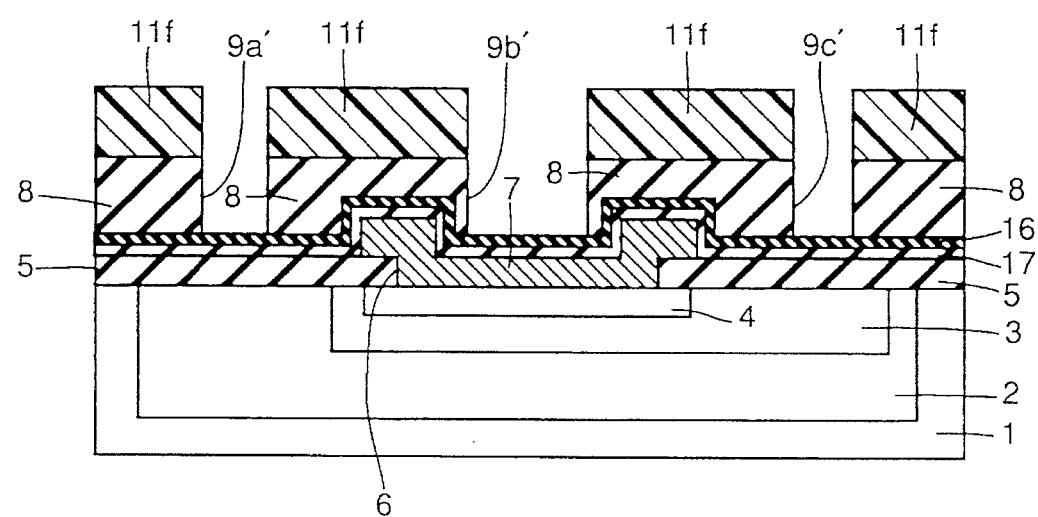
Figure 35:
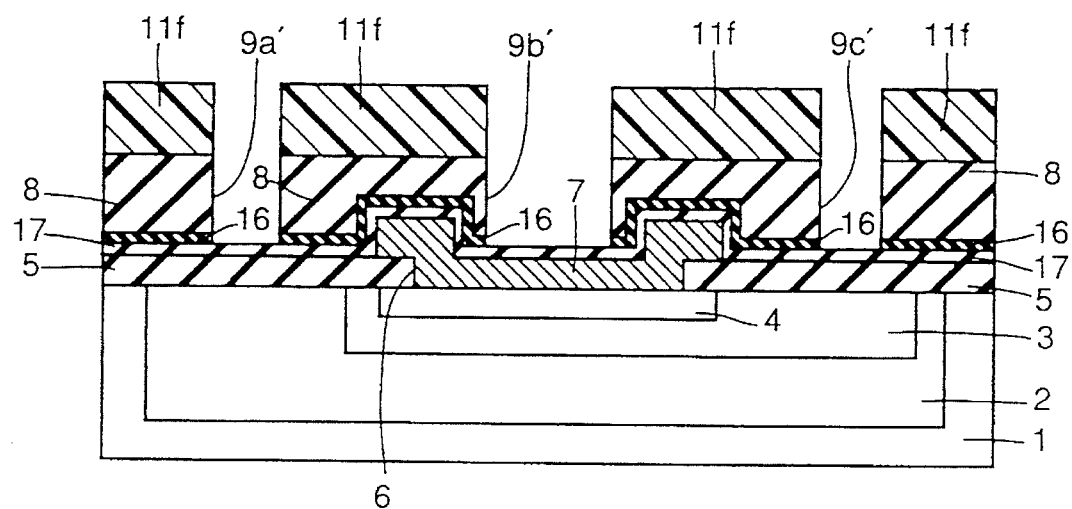

Referring to FIG. 34, according to manufacturing steps similar to those of the sixth embodiment, interlayer insulation layer 8, resist pattern 11f, and contact holes 9a', 9b', 9c' are respectively formed. Referring to FIG. 35, silicon nitride film 16 is etched according to a manufacturing step similar to that of the sixth embodiment. Since silicon oxide film 17 is present beneath silicon nitride film 16, silicon oxide film 17 can be used as an etching stopper in the etching step of silicon nitride film 16. In contrast to the sixth embodiment, polycrystalline silicon layer 7 will not be subjected to the etching of silicon nitride film 16.

Figure 36:
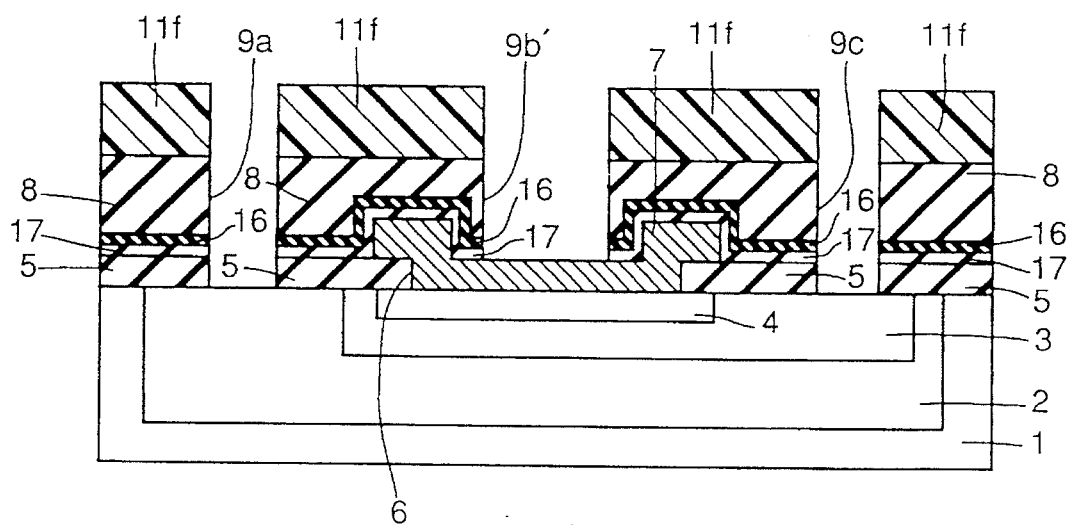

Referring to FIG. 36, silicon oxide film 17 and then insulation layer 5 are etched to expose a surface of collector region 2, a surface of base region 3, and a surface of polycrystalline silicon layer 7. Here, polycrystalline silicon layer 7 located right beneath contact hole 9b' is subjected only to an etching process that is carried out for silicon oxide film 17 and insulation layer 5. Therefore, there is hardly no change in the thickness of polycrystalline silicon layer 7. Thus, a stable contact between titanium silicide layer 14b and emitter region 4 can be provided.

The present modification is particularly effective when the etching selectivity between a silicon oxide film and polycrystalline silicon is easily obtained than the etching selectivity between a silicon nitride film and polycrystalline silicon.

Seventh Embodiment

A seventh embodiment of the present invention will be described hereinafter with reference to FIGS. 37–40.

Figure 37:
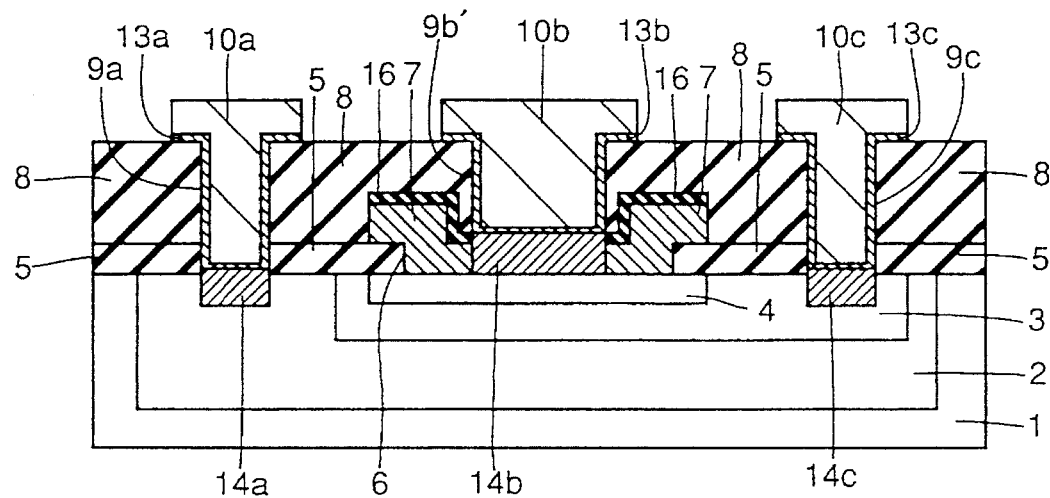
FIG. 37 is a sectional view showing a bipolar transistor according to a seventh embodiment of the present invention.

Referring to FIG. 37, silicon nitride film 16 is formed only on polycrystalline silicon layer 7. The remaining structure is similar to that of the sixth embodiment shown in FIG. 29. The formation of silicon nitride film 16 on polycrystalline silicon layer 7 provides the advantage that the thickness of polycrystalline silicon layer 7 located right beneath contact hole 9b' is hardly reduced. Thus, similar to the sixth embodiment, stable contact between titanium silicide layer 14b and emitter region 4 can be provided.

A method of manufacturing the bipolar transistor of the present embodiment will be described with reference to FIGS. 38–40.

Figure 38:
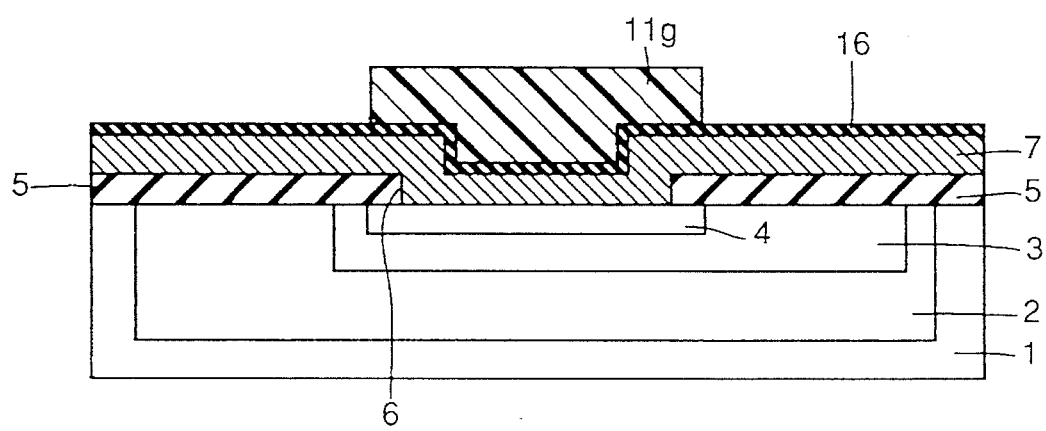
FIGS. 38–40 are sectional views of the bipolar transistor of FIG. 37 showing first to third manufacturing steps thereof.

Referring to FIG. 38, according to manufacturing steps similar to those of the first embodiment, contact hole 6 is formed. Polycrystalline silicon layer 7 is formed in contact hole 6 and on insulation layer 5 by CVD or the like. Then, an n type impurity such as arsenic (As) is introduced into polycrystalline silicon layer 7. Silicon nitride film 16 is formed on polycrystalline silicon layer 7 by CVD or the like. Then, a resist pattern 11g patterned so as to cover contact hole 6 is formed on silicon nitride film 16. Using resist pattern 11g as a mask, silicon nitride film 16 and then polycrystalline silicon layer 7 are etched. Then, resist pattern 11g is removed. Emitter region 4 is formed by diffusing the n type impurity from polycrystalline silicon layer 7 into base region 3.

Figure 39:
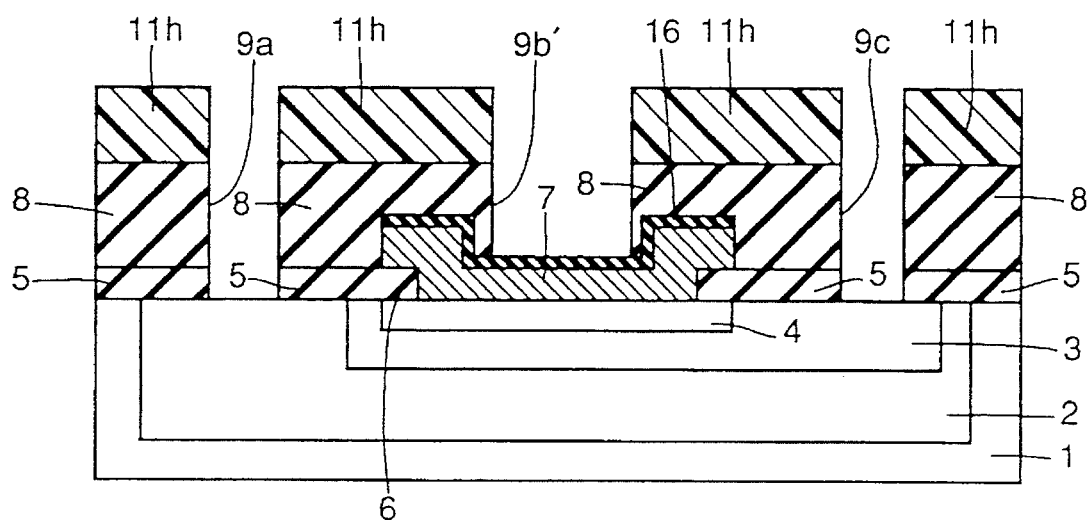

Referring to FIG. 39, interlayer insulation layer 8 is formed so as to cover silicon nitride film 16 and insulation layer 5 by CVD or the like. A resist pattern 11h having openings corresponding to the positions of contact holes 9a, 9b' and 9c is formed on interlayer insulation layer 8. Using resist pattern 11h as a mask, interlayer insulation layer 8 and insulation layer 5 are etched. Here, since silicon nitride film 16 is formed on polycrystalline silicon layer 7, silicon nitride film 16 can be used as an etching stopper by etching interlayer insulation layer 8 and insulation layer 5 according to conditions similar to those of the above-described sixth embodiment.

Figure 40:
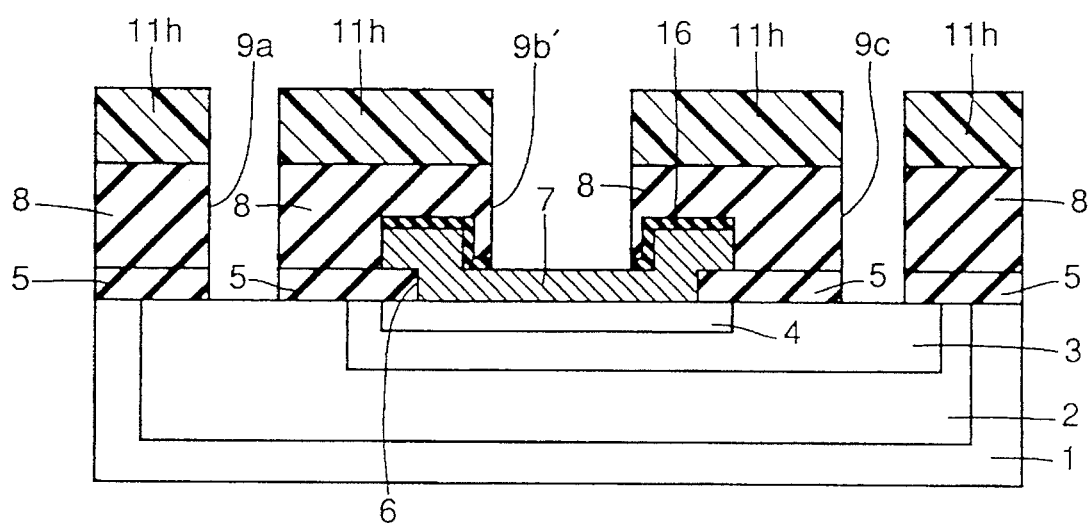

Referring to FIG. 40, silicon nitride film 16 is etched using resist pattern 11h as a mask. As a result, polycrystalline silicon layer 7 is partially exposed. Here, the surface of polycrystalline silicon layer 7 is subjected only to overetching during the etching of silicon nitride film 16. Therefore, the thickness of polycrystalline silicon layer 7 located right beneath contact hole 9b' hardly changes. Then, resist pattern 11h is removed.

Manufacturing steps similar to those of the sixth embodiment are carried out, resulting in the formation of the bipolar transistor of FIG. 37. Similar to the sixth embodiment, there is hardly no change in the thickness of polycrystalline silicon layer 7 located right beneath contact hole 9b'. Therefore, stable contact between titanium silicide layer 14b and emitter region 4 can be provided.

A modification of the above-described seventh embodiment will be described hereinafter with reference to FIGS. 41–43. The bipolar transistor of the present modification has a structure similar to that of the bipolar transistor of FIG. 37 except that a silicon oxide film 17 is provided between silicon nitride film 16 and polycrystalline silicon layer 7.

Figure 41:
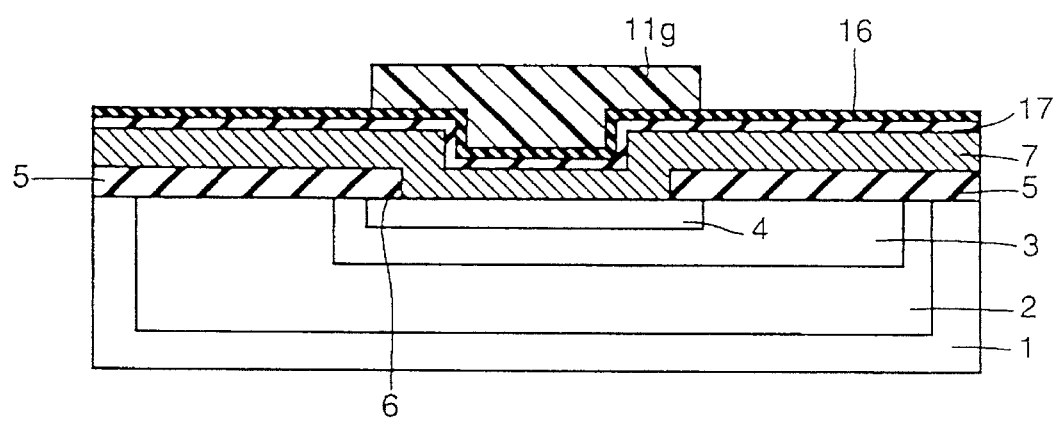
FIGS. 41–43 are sectional views of a modification of the bipolar transistor of the seventh embodiment of the present invention showing first to third manufacturing steps thereof.

Referring to FIG. 41, manufacturing steps similar to those of the above seventh embodiment are carried out to result in polycrystalline silicon layer 7. A silicon oxide film 17 is formed on polycrystalline silicon layer 7 by CVD or the like. A silicon nitride film 16 is formed on silicon oxide film 17 by CVD or the like. Then, a resist pattern 11g similar to that shown in FIG. 38 is formed on silicon nitride film 16. Using resist pattern 11g as a mask, silicon nitride film 16, silicon oxide film 17, and then polycrystalline silicon layer 7 are etched.

Figure 42:
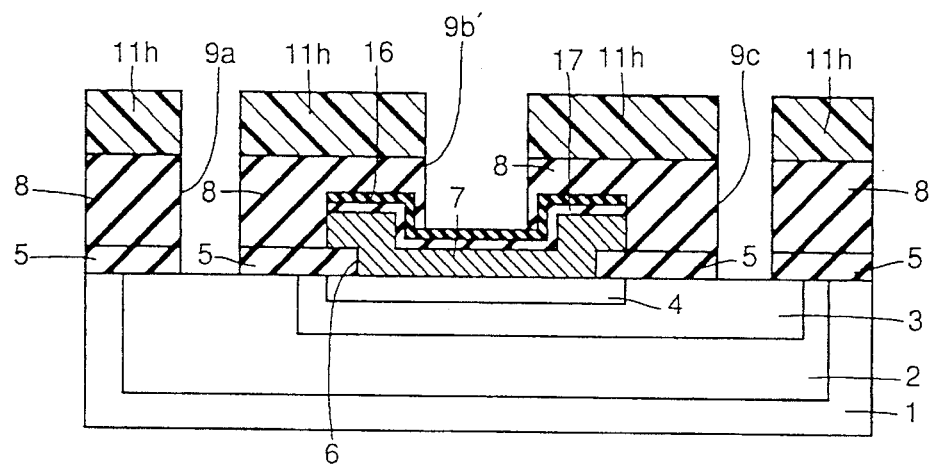

Referring to FIG. 42, according to manufacturing steps similar to those of the seventh embodiment, interlayer insulation layer 8, resist pattern 11h and contact holes 9a, 9b' and 9c are formed.

Figure 43:
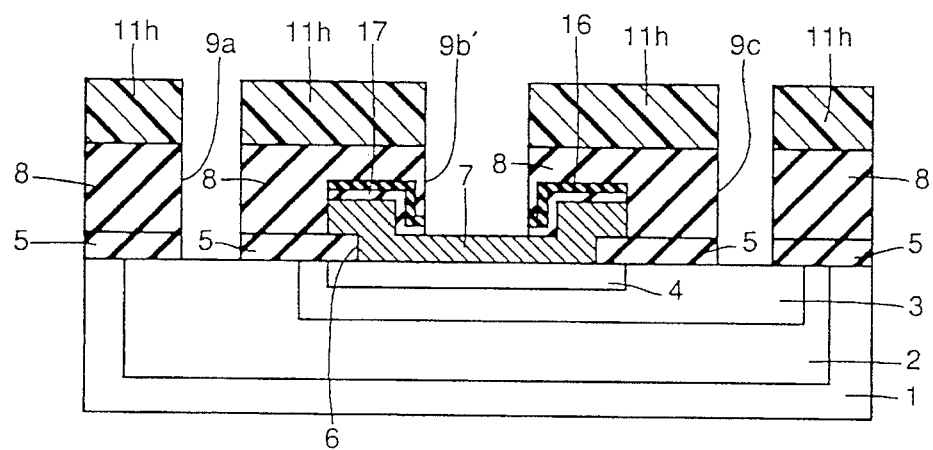

Referring to FIG. 43, using resist pattern 11h as a mask, silicon nitride film 16 is etched. Then, silicon oxide film 17 is etched. As a result, the surface of polycrystalline silicon layer is partially exposed. Similar to the modification of the sixth embodiment, there is hardly no change in the thickness of polycrystalline silicon layer 7 located right beneath contact hole 9b' in the present modification. Thus, stable contact between titanium silicide layer 14b and emitter region 4 can be provided.

Figure 44:
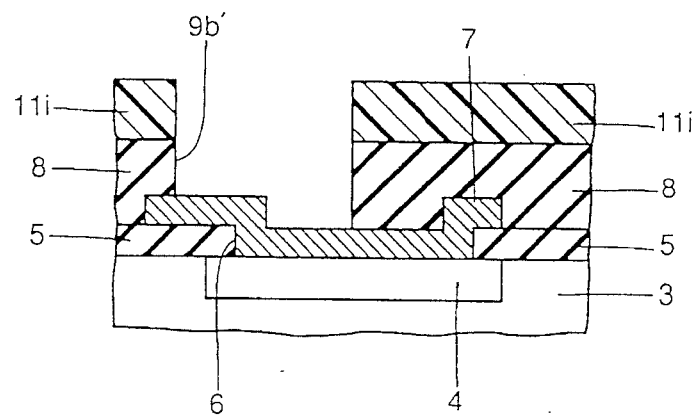
FIG. 44 shows a sectional view of a bipolar transistor in which the position of a contact hole is offset with respect to an emitter region.

The above embodiments are described in which opening portion 9b' is formed in the vicinity of the center of emitter region 4. However, opening portion 9b' may be offset from the center of emitter region 4 as shown in FIG. 44 as long as there is an overlapping portion with emitter region 4. In the above-described first and second embodiments, polycrystalline silicon layer 7 may have a polycide structure by forming a silicide layer such as of a tungsten silicide layer on polycrystalline silicon layer 7.

According to the present invention, in a bipolar transistor that has a polycrystalline silicon layer formed on an emitter region, contact between a metal electrode and an emitter region directly or via a silicide layer can be provided. Therefore, the resistance between an emitter region and an metal electrode can be reduced in comparison with that of a conventional bipolar transistor. Thus, the emitter resistance can be reduced, and the operating speed of a bipolar transistor can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar transistor comprising:
a semiconductor substrate of a first conductivity type having a main surface,
a collector region of a second conductivity type formed at the main surface of said semiconductor substrate,
a base region of the first conductivity type formed at a surface of said collector region,
an emitter region of the second conductivity type formed at a surface of said base region,
an insulation layer formed on the main surface of said semiconductor substrate and having a contact hole reaching a surface of said emitter region,
a polycrystalline silicon layer formed in contact with a surface of said emitter region within said insulation layer and having a hole defining a portion of said contact hole, and
a metal electrode formed in said contact hole so as to provide contact with a surface of said emitter region.

2. The bipolar transistor according to claim 1, wherein said polycrystalline silicon layer surrounds a bottom portion of said metal electrode.

3. The bipolar transistor according to claim 1, wherein a tungsten silicide layer is formed on a surface of said polycrystalline silicon layer.

4. A bipolar transistor comprising:
a semiconductor substrate of a first conductivity type having a main surface,
a collector region of a second conductivity type formed at the main surface of said semiconductor substrate,
a base region of the first conductivity type formed at a surface of said collector region,
an emitter region of the second conductivity type formed at a surface of said base region,
a silicide layer formed on a surface of said emitter region,
an insulation layer formed on the main surface of said semiconductor substrate and having a contact hole reaching a surface of said silicide layer,
a polycrystalline silicon layer continuous with a side face of said silicide layer, and formed within said insulation layer so as to surround said silicide layer and contact a surface of said emitter region, and
a metal electrode formed on said silicide layer.

5. The bipolar transistor according to claim 4, wherein said silicide layer comprises a transition metal silicide layer.

6. The bipolar transistor according to claim 4, wherein a barrier layer is formed between said silicide layer and said metal electrode for preventing reaction between said metal electrode and said semiconductor substrate.

7. The bipolar transistor according to claim 6, wherein said barrier layer is formed all over on the inside surface of said contact hole.

8. The bipolar transistor according to claim 4, wherein said silicide layer is formed by silicide reaction of said polycrystalline silicon layer located on said emitter region.

9. The bipolar transistor according to claim 4, wherein a nitride film is formed on said polycrystalline silicon layer so as to surround said contact hole, and said insulation layer is formed on said nitride film.

10. The bipolar transistor according to claim 9, wherein an oxide film is formed between said nitride film and said polycrystalline silicon layer.

11. A bipolar transistor comprising:
a semiconductor substrate of a first conductivity type having a main surface,
a collector region of a second conductivity type formed at the main surface of said semiconductor substrate,
a base region of the first conductivity type formed at a surface of said collector region,
an emitter region of the second conductivity type formed at a surface of said base region,
an insulation layer formed on the main surface of said semiconductor substrate, having a first contact hole on a surface of said emitter region, a second contact hole on a surface of said base region, and a third contact hole on a surface of said collector region,
a polycrystalline silicon layer formed within said insulation layer and having a hole defining a portion of said first contact hole and forming a contact with a surface of said emitter region,
a first metal electrode formed within said first contact hole so as to provide contact with a surface of said emitter region,
a second metal electrode formed within said second contact hole, and
a third metal electrode formed within said third contact hole.

12. The bipolar transistor according to claim 11, wherein a first concave portion is formed at a surface of said base region located within said second contact hole, and said second metal electrode is formed on a surface of said first concave portion, wherein a second concave portion is formed at a surface of said collector region located within said third contact hole, and said third metal electrode is formed on a surface of said second concave portion.

13. A bipolar transistor comprising:

a semiconductor substrate of a first conductivity type having a main surface, a collector region of a second conductivity type formed at the main surface of said semiconductor substrate, a base region of the first conductivity type formed at a surface of said collector region, an emitter region of the second conductivity type formed at a surface of said base region, a first silicide layer formed on a surface of said emitter region, a second silicide layer formed on a surface of said base region, a third silicide layer formed on a surface of said collector region, an insulation layer formed on the main surface of said semiconductor substrate, having a first contact hole reaching a surface of said first silicide layer, a second contact hole reaching a surface of said second silicide layer, and a third contact hole reaching a surface of said third silicide layer, a polycrystalline silicon layer continuous with a side face of said first silicide layer, and formed within said insulation layer so as to surround said first silicide layer and form a contact with a surface of said emitter region, and first, second and third metal electrodes formed on said first, second and third silicide layers.

14. The bipolar transistor according to claim 13, wherein a first barrier layer is formed between said first metal electrode and said first silicide layer to prevent reaction between said first metal electrode and said semiconductor substrate, a second barrier layer is formed between said second metal electrode and said second silicide layer to prevent reaction between said second metal electrode and said semiconductor substrate, and a third barrier layer is formed between said third metal electrode and said third silicide layer to prevent reaction between said third metal electrode and said semiconductor substrate.

15. The bipolar transistor according to claim 14, wherein said first, second and third silicide layers comprise titanium silicide layers, and said first, second and third barrier layers comprise titanium nitride layers.

16. A bipolar transistor comprising:

a semiconductor substrate of a first conductivity type having a main surface, a collector region of a second conductivity type formed at the main surface of said semiconductor substrate, a base region of the first conductivity type formed at a surface of said collector region, an emitter region of the second conductivity type formed at a surface of said base region, an insulation layer formed on the main surface of said semiconductor substrate and having a contact hole reaching a surface of said emitter region, a polycrystalline silicon layer containing an impurity of the second conductivity type formed in contact with a surface of said emitter region within said insulation layer and having a hole defining a portion of said contact hole, and a metal electrode formed in said contact hole so as to provide contact with a surface of said emitter region.

17. A bipolar transistor comprising:

a semiconductor substrate of a first conductivity type having a main surface, a collector region of a second conductivity type formed at the main surface of said semiconductor substrate, a base region of the first conductivity type formed at a surface of said collector region, an emitter region, formed by out diffusion of an impurity of the second conductivity type at a surface of said base region, an insulation layer formed on the main surface of said semiconductor substrate and having a contact hole reaching a surface of said emitter region, a polycrystalline silicon layer formed in contact with a surface of said emitter region within said insulation layer and having a hole defining a portion of said contact hole, and a metal electrode formed in said contact hole so as to provide contact with a surface of said emitter region.

18. A bipolar transistor comprising:

a semiconductor substrate of a first conductivity type having a main surface, a collector region of a second conductivity type formed at the main surface of said semiconductor substrate, a base region of the first conductivity type formed at a surface of said collector region, an emitter region of the second conductivity type formed at a surface of said base region, an insulation layer formed on the main surface of said semiconductor substrate and having a contact hole reaching a surface of said emitter region, a polycrystalline silicon layer formed within said insulation layer and having a hole defining a portion of said contact hole, and a metal electrode formed in said contact hole so as to provide contact with a surface of said emitter region, wherein said polycrystalline silicon layer extends non-uniformly around a bottom portion of said metal electrode due to photolithographic misalignment.

* * * * *